(12) United States Patent
Ohguro et al.

(10) Patent No.: US 11,594,476 B2
(45) Date of Patent: Feb. 28, 2023

(54) PLURALITY OF LEADS BETWEEN MOSFET CHIPS

(71) Applicants: Kabushiki Kaisha Toshiba, Tokyo (JP); Toshiba Electronic Devices & Storage Corporation, Tokyo (JP)

(72) Inventors: Tatsuya Ohguro, Kanazawa Ishikawa (JP); Hideharu Kojima, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 11 days.

(21) Appl. No.: 17/201,544

(22) Filed: Mar. 15, 2021

(65) Prior Publication Data

US 2022/0084917 A1 Mar. 17, 2022

(30) Foreign Application Priority Data

Sep. 15, 2020 (JP) .............................. JP2020-154924

(51) Int. Cl.
| | |
|---|---|
| *H01L 27/088* | (2006.01) |
| *H01L 21/00* | (2006.01) |
| *H01L 23/495* | (2006.01) |
| *H01L 23/00* | (2006.01) |
| *H01L 23/31* | (2006.01) |

(52) U.S. Cl.
CPC .... *H01L 23/49575* (2013.01); *H01L 23/3107* (2013.01); *H01L 23/49503* (2013.01);
(Continued)

(58) Field of Classification Search
CPC ............... H01L 23/562; H01L 23/3121; H01L 23/49894; H01L 23/3107; H01L 23/49541;
(Continued)

(56) References Cited

U.S. PATENT DOCUMENTS 8,431,436 B1 4/2013 Nguyen
8,581,376 B2 * 11/2013 Yilmaz ............. H01L 23/49537
257/676

(Continued)

FOREIGN PATENT DOCUMENTS

| JP | 2013-098541 A | 5/2013 |
|---|---|---|
| JP | 6086989 B1 | 3/2017 |
| JP | 6402281 B1 | 10/2018 |

*Primary Examiner* — Alonzo Chambliss
(74) *Attorney, Agent, or Firm* — Allen & Overy LLP

(57) ABSTRACT

A semiconductor device includes: a first chip including first and second electrodes provided at a first surface, and a third electrode provided at a second surface positioned at a side opposite to the first surface; a second chip including fourth and fifth electrodes provided at a third surface, and a sixth electrode provided at a fourth surface positioned at a side opposite to the third surface, wherein the second chip is disposed to cause the third surface to face the first surface; a first connector disposed between the first electrode and the fourth electrode and connected to the first and fourth electrodes; and a second connector disposed between the second electrode and the fifth electrode and connected to the second and fifth electrodes.

18 Claims, 17 Drawing Sheets

(52) U.S. Cl.
CPC .. *H01L 23/49524* (2013.01); *H01L 23/49562* (2013.01); *H01L 23/49568* (2013.01); *H01L 24/40* (2013.01); *H01L 24/41* (2013.01); *H01L 2224/4005* (2013.01); *H01L 2224/40245* (2013.01); *H01L 2924/13091* (2013.01)

(58) Field of Classification Search
CPC ..... H01L 24/37; H01L 24/83; H01L 21/4846; H01L 2924/181; H01L 2924/1306; H01L 24/41

See application file for complete search history.

(56) References Cited

U.S. PATENT DOCUMENTS

| | | | | |
|---|---|---|---|---|
| 9,024,423 | B2* | 5/2015 | Muto | H01L 23/49582 |
| | | | | 257/E27.137 |
| 9,997,437 | B2 | 6/2018 | Ikeda | |
| 2005/0224945 | A1* | 10/2005 | Saito | H01L 23/49575 |
| | | | | 257/E23.052 |
| 2006/0118932 | A1* | 6/2006 | Nanba | H01L 24/29 |
| | | | | 257/E23.044 |
| 2008/0265386 | A1* | 10/2008 | Muto | H01L 24/77 |
| | | | | 257/676 |
| 2009/0189264 | A1* | 7/2009 | Yato | H01L 23/49513 |
| | | | | 257/676 |
| 2015/0001618 | A1* | 1/2015 | Hebert | H01L 23/4951 |
| | | | | 257/337 |
| 2020/0144162 | A1* | 5/2020 | Chaowasakoo | H01L 23/49513 |
| 2020/0273833 | A1 | 8/2020 | Ikeda et al. | |

* cited by examiner

PLURALITY OF LEADS BETWEEN MOSFET CHIPS

CROSS-REFERENCE TO RELATED APPLICATIONS

This application is based upon and claims the benefit of priority from the prior Japanese Patent Application No. 2020-154924, filed on Sep. 15, 2020; the entire contents of which are incorporated herein by reference.

FIELD

Embodiments relate to a semiconductor device.

BACKGROUND

There are cases where chips of power semiconductors such as MOSFETs (Metal-Oxide-Semiconductor Field-Effect Transistors) or the like are connected in parallel so that a large current can be output while suppressing the on-resistance.

DETAILED DESCRIPTION

A semiconductor device according to an embodiment includes: a first chip including first and second electrodes provided at a first surface of the first chip, and a third electrode provided at a second surface of the first chip positioned at a side opposite to the first surface; a second chip including fourth and fifth electrodes provided at a third surface of the second chip, and a sixth electrode provided at a fourth surface of the second chip positioned at a side opposite to the third surface, wherein the second chip is disposed to cause the third surface to face the first surface; a first connector disposed between the first chip and the second chip and connected to the first and fourth electrodes; and a second connector disposed between the first chip and the second chip and connected to the second and fifth electrodes.

First Embodiment

First, a first embodiment will be described.

Figure 1:
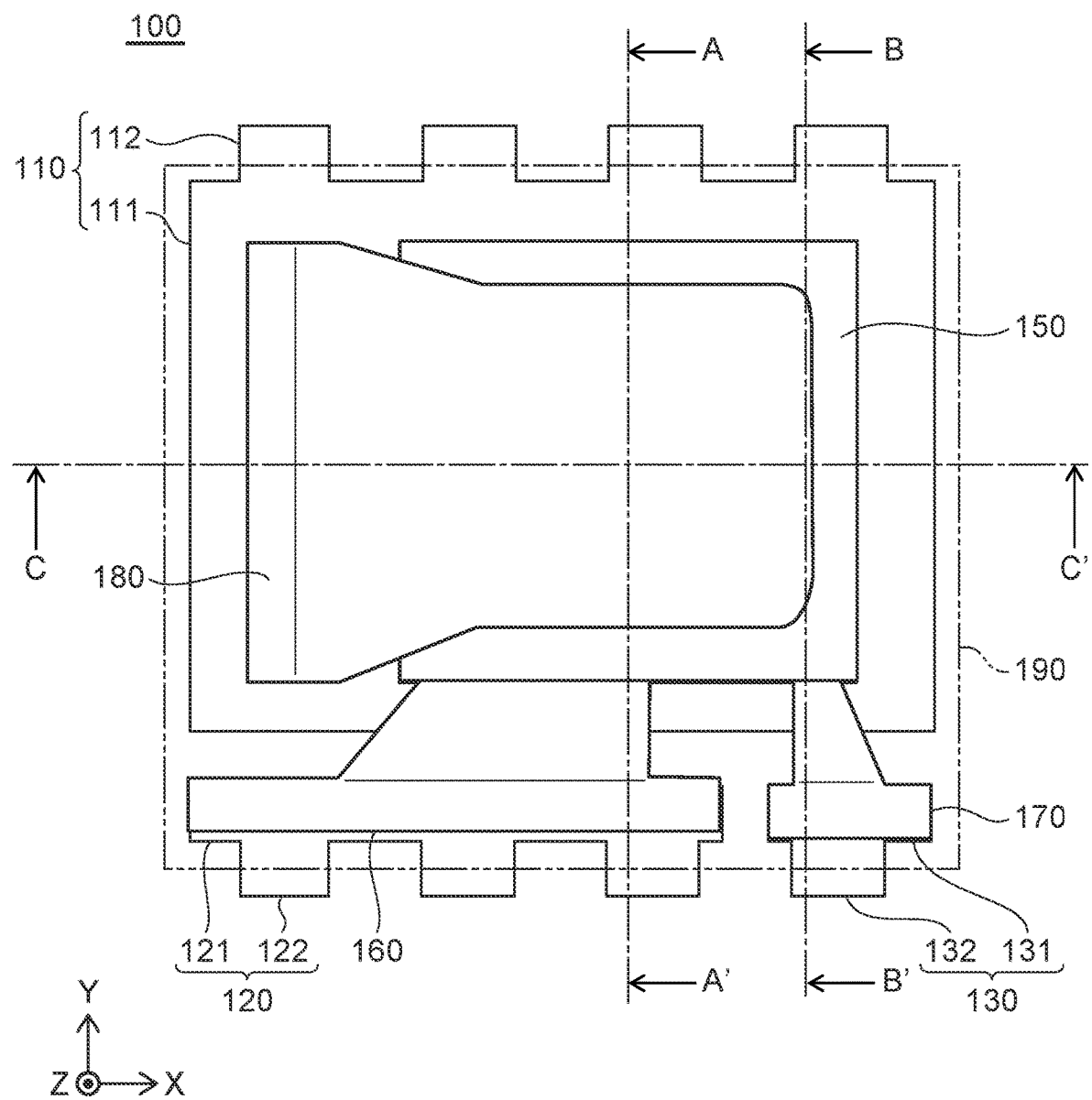
FIG. 1 is a top view showing a semiconductor device according to a first embodiment.

FIG. 1 is a top view showing a semiconductor device according to the embodiment.

Figure 2:
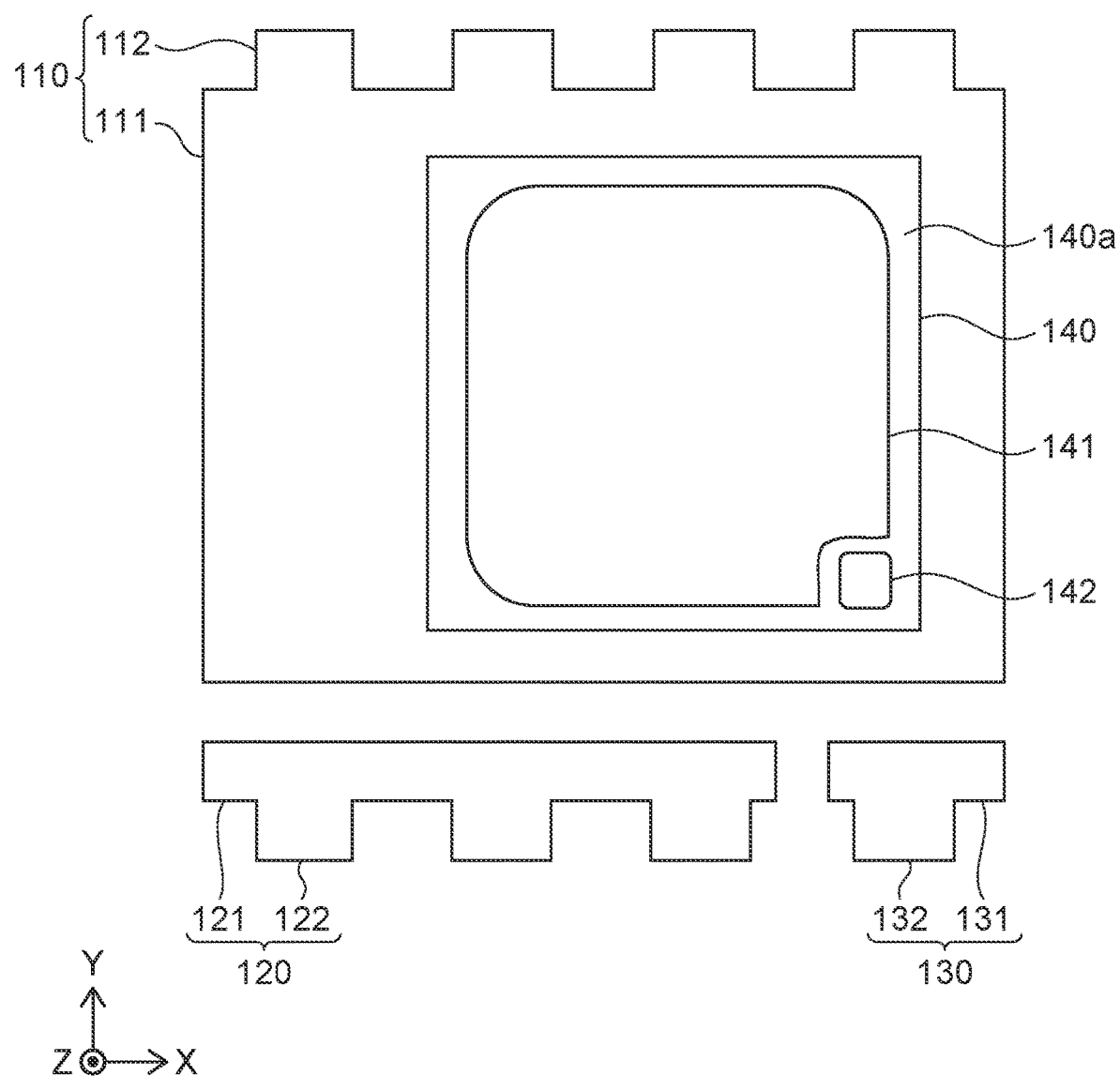
FIG. 2 is a top view showing a substrate, a first lead, a second lead, and a first chip of the semiconductor device according to the first embodiment.

FIG. 2 is a top view showing a substrate, a first lead, a second lead, and a first chip of the semiconductor device according to the embodiment.

Figure 3:
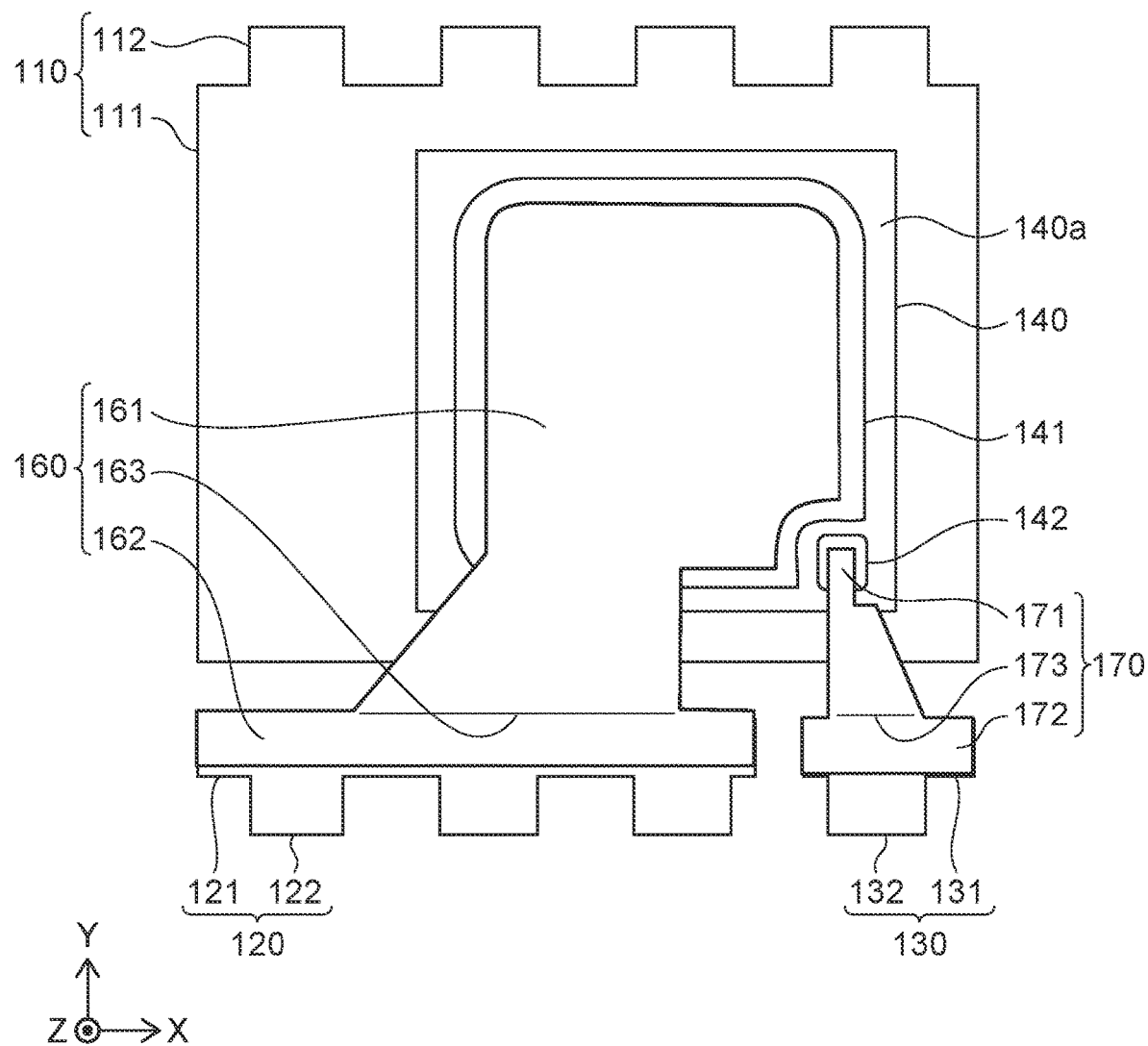
FIG. 3 is a top view showing the substrate, the first lead, the second lead, the first chip, the first connector, and a second connector of the semiconductor device according to the first embodiment.

FIG. 3 is a top view showing the substrate, the first lead, the second lead, the first chip, the first connector, and a second connector of the semiconductor device according to the embodiment.

Figure 4:
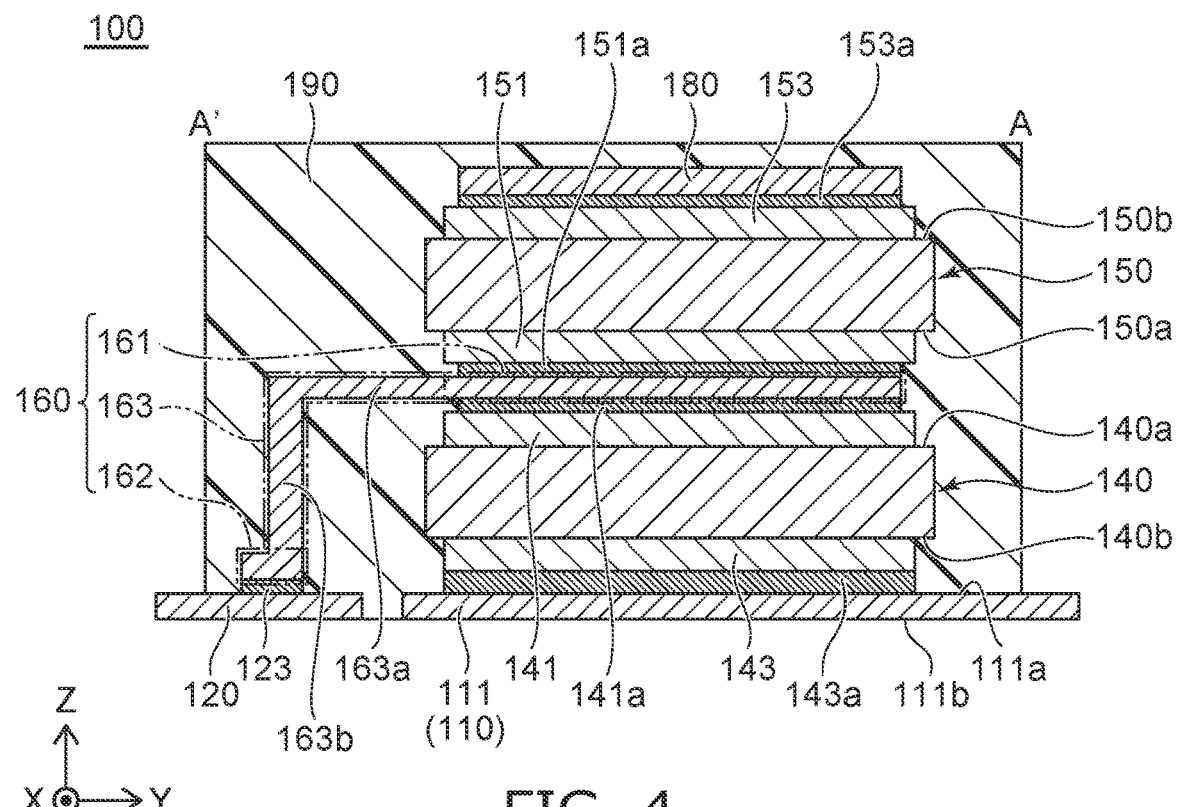
FIG. 4 is a cross-sectional view along line A-A' of FIG. 1.

FIG. 4 is a cross-sectional view along line A-A' of FIG. 1.

Figure 5:
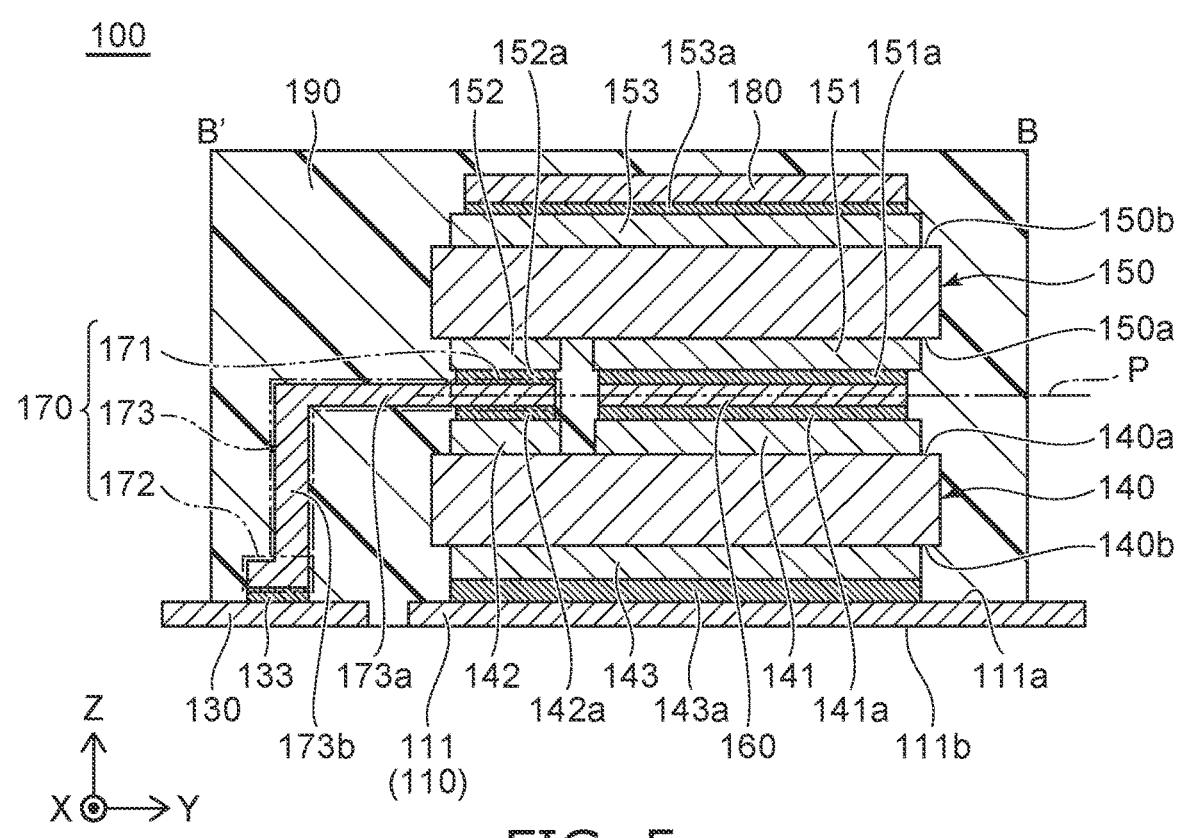
FIG. 5 is a cross-sectional view along line B-B' of FIG. 1.

FIG. 5 is a cross-sectional view along line B-B' of FIG. 1.

Figure 6A:
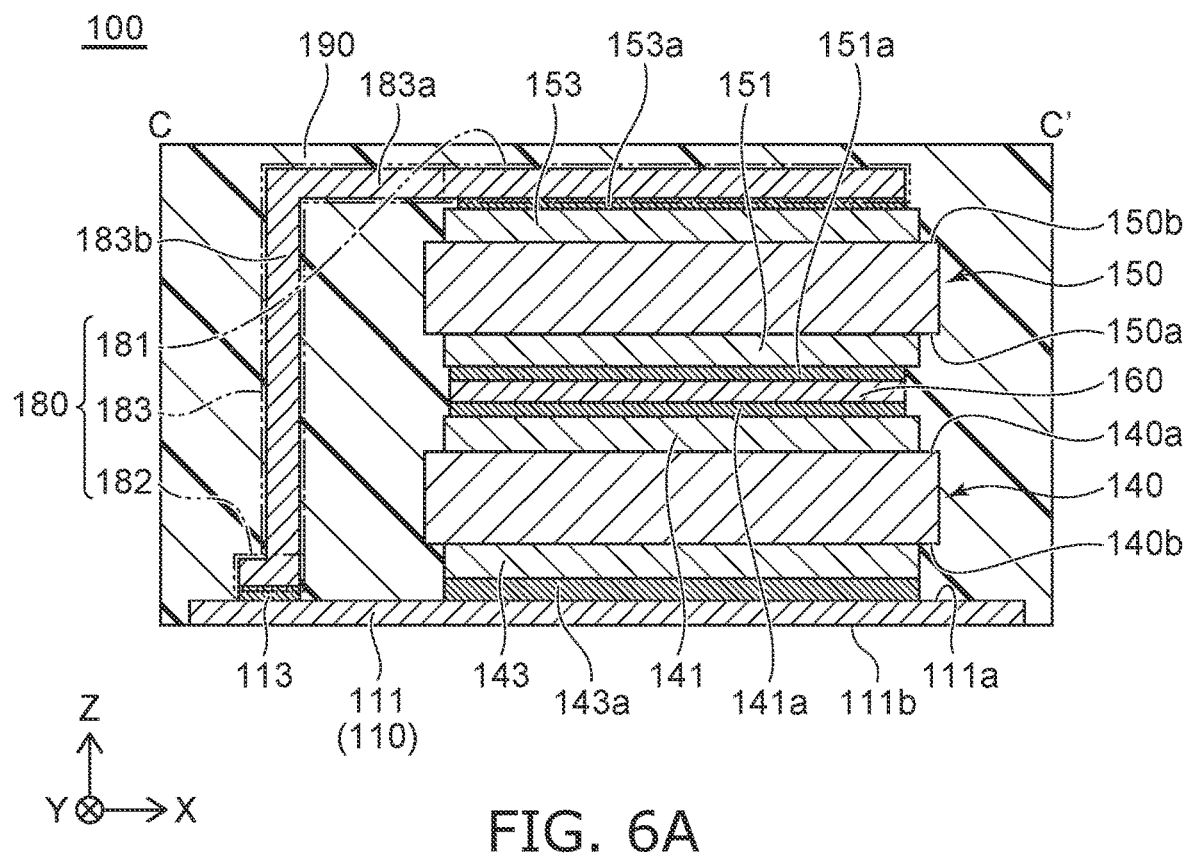
FIG. 6A is a cross-sectional view along line C-C' of FIG. 1.

FIG. 6A is a cross-sectional view along line C-C' of FIG. 1.

Figure 6B:
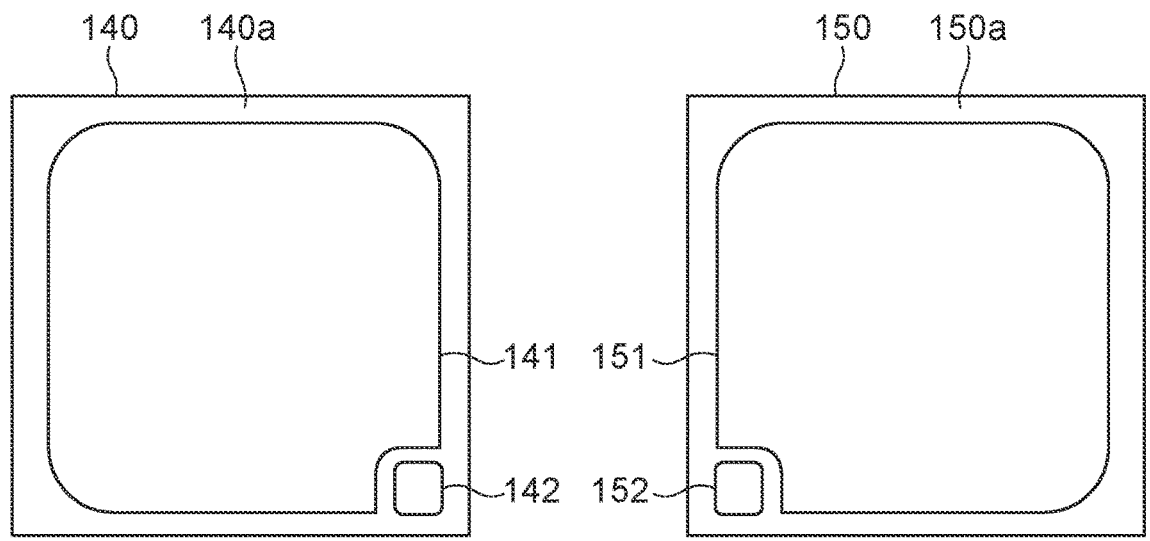
FIG. 6B is a plan view showing the lower surface of the first chip and the upper surface of the second chip of the semiconductor device according to the first embodiment.

FIG. 6B is a plan view showing the lower surface of the first chip and the upper surface of the second chip of the semiconductor device according to the embodiment.

Generally speaking, as shown in FIGS. 1 and 5, the semiconductor device 100 according to the embodiment includes a substrate 110, a first lead 120, a second lead 130, a first chip 140, a second chip 150, a first connector 160, a second connector 170, a third connector 180, and a resin member 190. In FIG. 1, the resin member 190 is illustrated by a double dot-dash line for easier understanding of the internal structure of the semiconductor device 100.

The components of the semiconductor device 100 will now be elaborated. Hereinbelow, an XYZ orthogonal coordinate system is used for easier understanding of the description. The direction from the first chip 140 toward the second chip 150 is taken as a "Z-direction". One direction orthogonal to the Z-direction is taken as an "X-direction". One direction orthogonal to the Z-direction and the X-direction is taken as a "Y-direction". The Z-direction is called the "upward direction". The reverse direction of the upward direction is called the "downward direction". However, the upward direction and the downward direction are unrelated to the direction of gravity.

For example, the substrate 110 is made of a metal material. As shown in FIG. 2, the substrate 110 includes a main part 111, and multiple extension parts 112 that are connected to the main part 111 and extend in the Y-direction. The main part 111 is substantially rectangular when viewed in top-view. As shown in FIG. 4, an upper surface 111*a* and a lower surface 111*b* of the main part 111 are flat surfaces and are substantially parallel to the X-direction and the Y-direction. However, the shape of the substrate is not limited to that described above.

For example, the first lead 120 is made of a metal material. As shown in FIG. 2, the first lead 120 is separated from the substrate 110. The first lead 120 is next to the substrate 110 in the Y-direction. The first lead 120 is flat-plate shaped. The first lead 120 includes a first extension part 121 that extends in the X-direction, and multiple second extension parts 122 that are connected to the first extension part 121 and extend in the Y-direction. However, the position and the shape of the first lead are not limited to those described above.

The second lead 130 is made of a material similar to that of the first lead 120. The second lead 130 is separated from the substrate 110 and the first lead 120. The second lead 130 is next to the substrate 110 in the Y-direction and next to the first lead 120 in the X-direction. The second lead 130 is flat-plate shaped. The second lead 130 includes a first extension part 131 that extends in the X-direction, and a second extension part 132 that is connected to the first extension part 131 and extends in the Y-direction. However, the position and the shape of the second lead are not limited to those described above.

The first chip 140 is disposed on the substrate 110. In the embodiment, the first chip 140 is a MOSFET. Although not particularly limited, the breakdown voltage of the first chip 140 is, for example, not less than 100 V. The first chip 140 is flat-plate shaped. In the embodiment, the first chip 140 is substantially square when viewed in top-view. However, the shape of the first chip when viewed in top-view is not limited to that described above. As shown in FIG. 5, the surfaces of the first chip 140 include an upper surface (a first surface) 140*a*, and a lower surface (a second surface) 140*b* positioned at the side opposite to the upper surface 140*a*.

A source electrode (a first electrode) 141 and a gate electrode (a second electrode) 142 are provided at the upper surface 140*a*. A drain electrode (a third electrode) 143 is provided at the lower surface 140*b*. The drain electrode 143 is connected to the substrate 110 by an electrically-conductive bonding member 143*a* such as solder, etc.

It is favorable for the source electrode 141, the gate electrode 142, and the drain electrode 143 to be made of metal materials such as copper (Cu) or the like that have higher thermal conductivities than bonding members 141*a*, 142*a*, and 143*a* described below. It is favorable for the film thicknesses of the source electrode 141, the gate electrode 142, and the drain electrode 143 to be not less than 5 μm and not more than 20 μm. However, the materials and the film thicknesses of the source electrode, the gate electrode, and the drain electrode are not limited to those described above.

As shown in FIG. 2, the shape of the source electrode 141 when viewed in top-view is such that one corner of a rectangle is cut away, and the other corners are rounded. The gate electrode 142 is substantially rectangular when viewed in top-view. The gate electrode 142 is separated from the source electrode 141 and is disposed in the region where the corner of the source electrode 141 is cut away. However, the positions and the shapes of the source electrode and the gate electrode are not limited to those described above.

In the embodiment, the second chip 150 is a MOSFET. Although not particularly limited, the breakdown voltage of the second chip 150 is, for example, not less than 100 V. The second chip 150 is flat-plate shaped. In the embodiment as shown in FIG. 6B, the second chip 150 is substantially square when viewed in bottom-view. However, the shape of the second chip when viewed in bottom-view is not limited to that described above. The second chip 150 faces the first chip 140. The surfaces of the second chip 150 include a lower surface (a third surface) 150*a* that faces the upper surface 140*a* of the first chip 140, and an upper surface (a fourth surface) 150*b* that is positioned at the side opposite to the lower surface 150*a*.

A source electrode (a fourth electrode) 151 and a gate electrode (a fifth electrode) 152 are provided at the lower surface 150*a*. As shown in FIG. 5, a drain electrode (a sixth electrode) 153 is provided at the upper surface 150*b*. The source electrode 151 faces the source electrode 141 of the first chip 140. As shown in FIG. 6B, the shape of the source electrode 151 is substantially the same as the shape of the source electrode 141 of the first chip 140. The surface area of the source electrode 151 is substantially equal to the surface area of the source electrode 141 of the first chip 140. As shown in FIG. 5, the gate electrode 152 faces the gate electrode 142 of the first chip 140. As shown in FIG. 6B, the shape of the gate electrode 152 is substantially the same as the shape of the gate electrode 142 of the first chip 140. The surface area of the gate electrode 152 is substantially equal to the surface area of the gate electrode 142 of the first chip 140. In other words, as shown in FIG. 5, the first chip 140 and the second chip 150 are substantially symmetric when referenced to a plane P that is parallel to the X-direction and the Y-direction and passes through the center of the gap between the first chip 140 and the second chip 150. However, the positions and the shapes of the source electrodes and the gate electrodes are not limited to those described above. For example, the second chip and the first chip may not be symmetric with respect to the plane P.

As shown in FIG. 5, it is favorable for the source electrode 151, the gate electrode 152, and the drain electrode 153 to be made of metal materials such as copper (Cu) or the like that have higher thermal conductivities than bonding members 151*a*, 152*a*, and 153*a* described below. It is favorable for the film thicknesses of the source electrode 151, the gate electrode 152, and the drain electrode 153 to be not less than 5 μm and not more than 20 μm. However, the materials and the film thicknesses of the source electrode, the gate electrode, and the drain electrode are not limited to those described above.

As shown in FIGS. 3 and 4, the first connector 160 is connected to the source electrode 141 of the first chip 140, the source electrode 151 of the second chip 150, and the first lead 120. For example, the first connector 160 is made of a metal material such as copper (Cu) or the like that has a high thermal conductivity.

In the embodiment, the first connector 160 includes a first distal part 161 disposed between the source electrode 141 of the first chip 140 and the source electrode 151 of the second chip 150, a first proximal part 162 disposed on the first lead 120, and a first middle part 163 positioned between the first distal part 161 and the first proximal part 162.

The first distal part 161 is substantially flat-plate shaped. The first distal part 161 is connected to the source electrode 141 of the first chip 140 by the electrically-conductive bonding member 141a such as solder, etc. Also, the first distal part 161 is connected to the source electrode 151 of the second chip 150 by the electrically-conductive bonding member 151a such as solder, etc.

The first proximal part 162 is substantially flat-plate shaped. The first proximal part 162 is connected to the first lead 120 by an electrically-conductive bonding member 123 such as solder, etc.

The first middle part 163 is L-shaped. Specifically, the first middle part 163 includes a first portion 163a that extends in the Y-direction from the Y-direction end portion of the first distal part 161, and a second portion 163b that extends in the Z-direction and is connected to the first portion 163a and the upper end of the first proximal part 162. However, the shape of the first connector is not limited to that described above.

As shown in FIGS. 3 and 5, the second connector 170 is connected to the gate electrode 142 of the first chip 140, the gate electrode 152 of the second chip 150, and the second lead 130. The second connector 170 is made of a material similar to the first connector 160.

The second connector 170 includes a second distal part 171 disposed between the gate electrode 142 of the first chip 140 and the gate electrode 152 of the second chip 150, a second proximal part 172 disposed on the second lead 130, and a second middle part 173 positioned between the second distal part 171 and the second proximal part 172.

The second distal part 171 is substantially flat-plate shaped. The second distal part 171 is connected to the gate electrode 142 of the first chip 140 by the electrically-conductive bonding member 142a such as solder, etc. The second distal part 171 is connected to the gate electrode 152 of the second chip 150 by the electrically-conductive bonding member 152a such as solder, etc.

The second proximal part 172 is substantially flat-plate shaped. The second proximal part 172 is connected to the second lead 130 by an electrically-conductive bonding member 133 such as solder, etc.

The second middle part 173 is L-shaped. Specifically, the second middle part 173 includes a first portion 173a that extends in the Y-direction from the Y-direction end portion of the first distal part 161, and a second portion 173b that extends in the Z-direction and is connected to the first portion 173a and the upper end of the second proximal part 172. However, the shape of the second connector is not limited to that described above.

As shown in FIG. 6A, the third connector 180 is connected to the substrate 110 and the drain electrode 153 of the second chip 150. The third connector 180 is made of a material similar to the first connector 160.

The third connector 180 includes a third distal part 181 that is disposed on the drain electrode 153 of the second chip 150, a third proximal part 182 that is disposed on the substrate 110, and a third middle part 183 that is positioned between the third distal part 181 and the third proximal part 182.

The third distal part 181 is substantially flat-plate shaped. The third distal part 181 is connected to the drain electrode 153 of the second chip 150 by the electrically-conductive bonding member 153a such as solder, etc.

The third proximal part 182 is substantially flat-plate shaped. The third proximal part 182 is connected to the substrate 110 by an electrically-conductive bonding member 113 such as solder, etc.

The third middle part 183 is L-shaped. The third middle part 183 includes a first portion 183a that extends in the X-direction from the X-direction end portion of the third distal part 181, and a second portion 183b that extends in the Z-direction and is connected to the first portion 183a and the upper end of the third proximal part 182.

As shown in FIGS. 4 to 6A, the resin member 190 seals the first chip 140, the second chip 150, the first connector 160, the second connector 170, and the third connector 180.

As shown in FIG. 1, the resin member 190 covers the main part 111 and portions of the extension parts 112 of the substrate 110. The resin member 190 covers the first extension part 121 and portions of the second extension parts 122 of the first lead 120. The resin member 190 covers the first extension part 131 and a portion of the second extension part 132 of the second lead 130. The resin member 190 does not cover the other parts of the extension parts 112 of the substrate 110, the other parts of the second extension parts 122 of the first lead 120, and the other part of the second extension part 132 of the second lead 130. For example, the resin member 190 is made of a resin material such as a thermosetting resin, etc.

A method for manufacturing the semiconductor device 100 according to the embodiment will now be described.

Figure 7A:
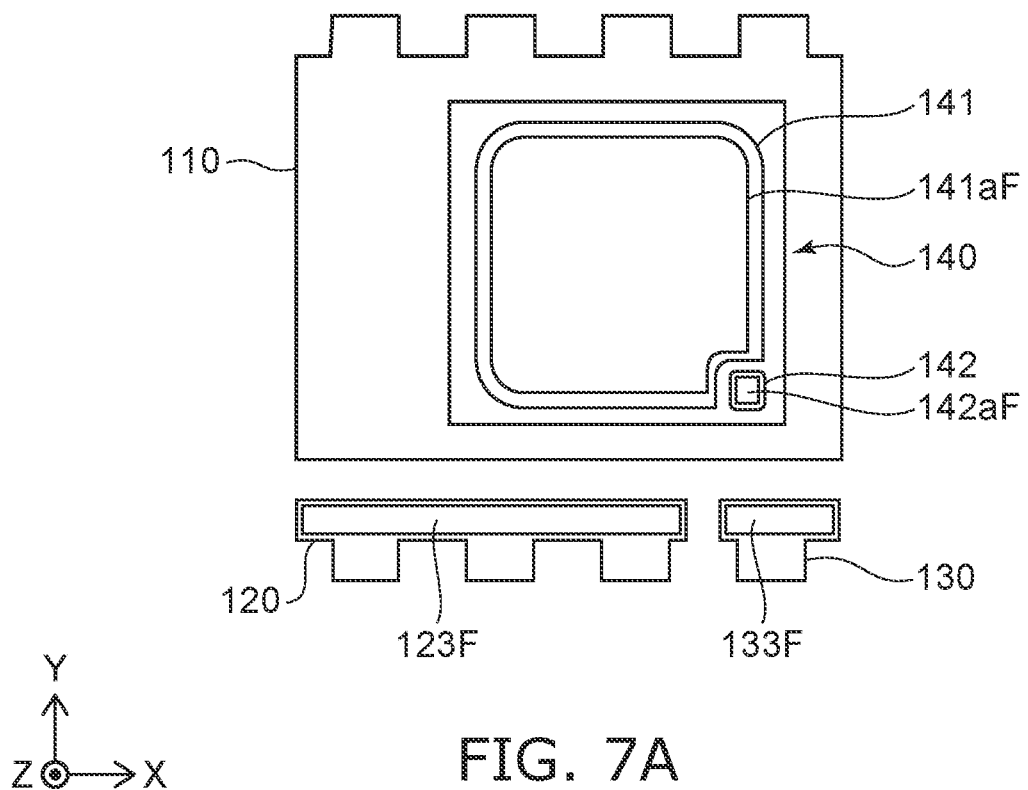
FIG. 7A is a top view showing a method for manufacturing the semiconductor device according to the first embodiment.
Figure 7B:
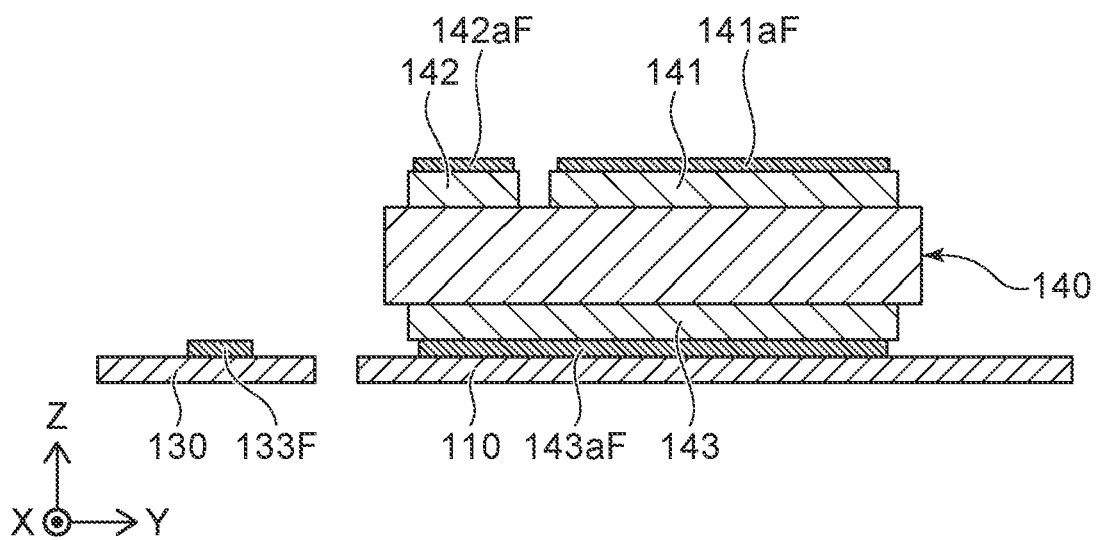
FIG. 7B is a cross-sectional view showing the method for manufacturing the semiconductor device according to the first embodiment.

FIG. 7A is a top view showing the method for manufacturing the semiconductor device according to the embodiment, and FIG. 7B is a cross-sectional view showing the method for manufacturing the semiconductor device according to the embodiment.

Figure 8A:
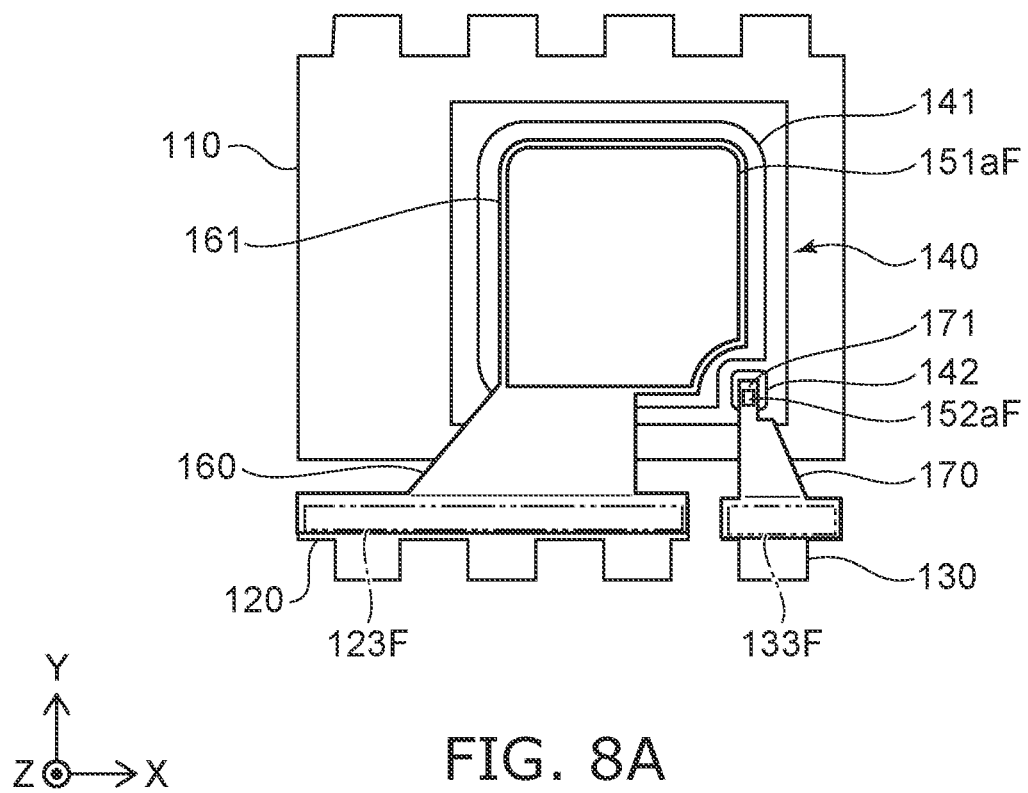
FIG. 8A is a top view showing the method for manufacturing the semiconductor device according to the first embodiment.
Figure 8B:
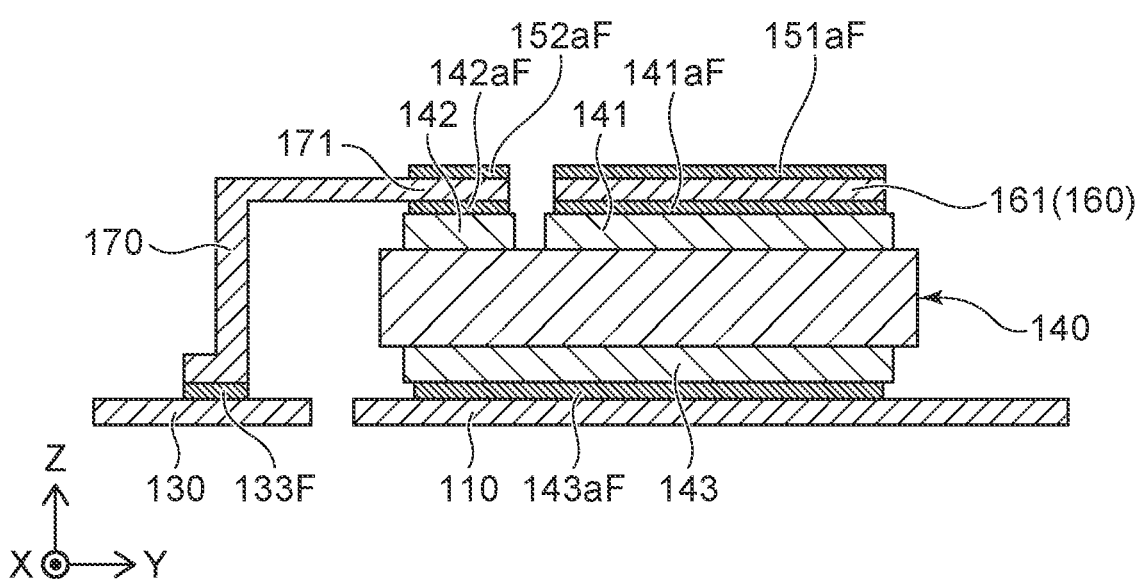
FIG. 8B is a cross-sectional view showing the method for manufacturing the semiconductor device according to the first embodiment.

FIG. 8A is a top view showing the method for manufacturing the semiconductor device according to the embodiment, and FIG. 8B is a cross-sectional view showing the method for manufacturing the semiconductor device according to the embodiment.

Figure 9A:
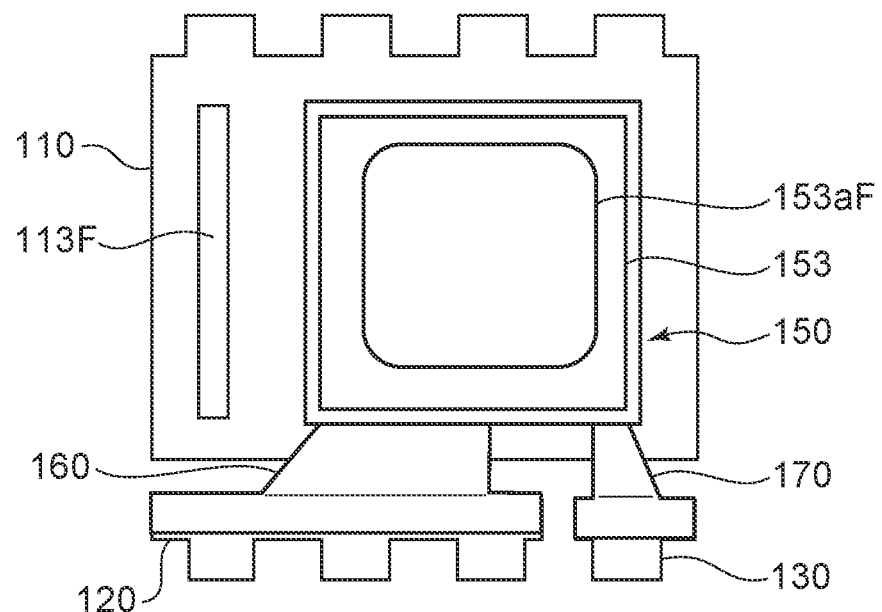
FIG. 9A is a top view showing the method for manufacturing the semiconductor device according to the first embodiment.
Figure 9B:
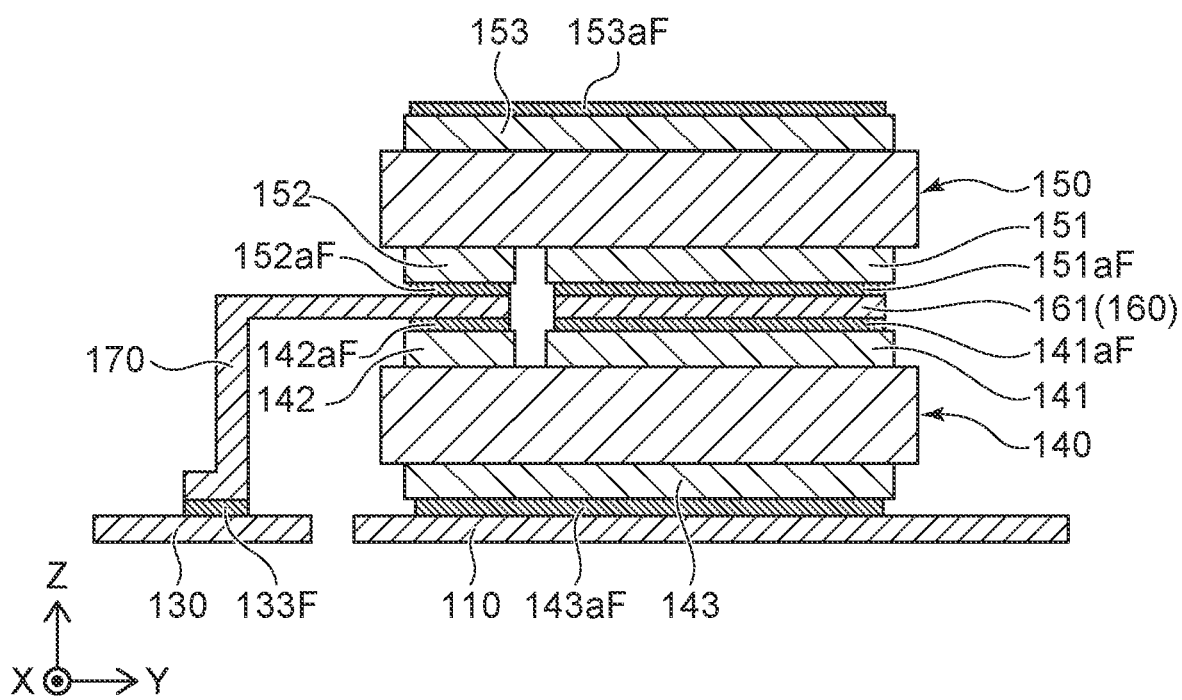
FIG. 9B is a cross-sectional view showing the method for manufacturing the semiconductor device according to the first embodiment.

FIG. 9A is a top view showing the method for manufacturing the semiconductor device according to the embodiment, and FIG. 9B is a cross-sectional view showing the method for manufacturing the semiconductor device according to the embodiment.

Figure 10A:
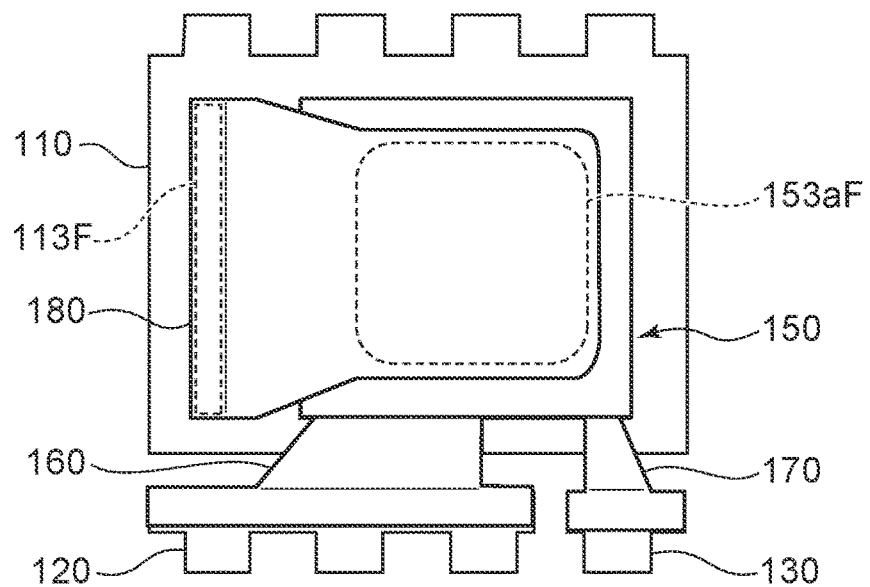
FIG. 10A is a top view showing the method for manufacturing the semiconductor device according to the first embodiment.
Figure 10B:
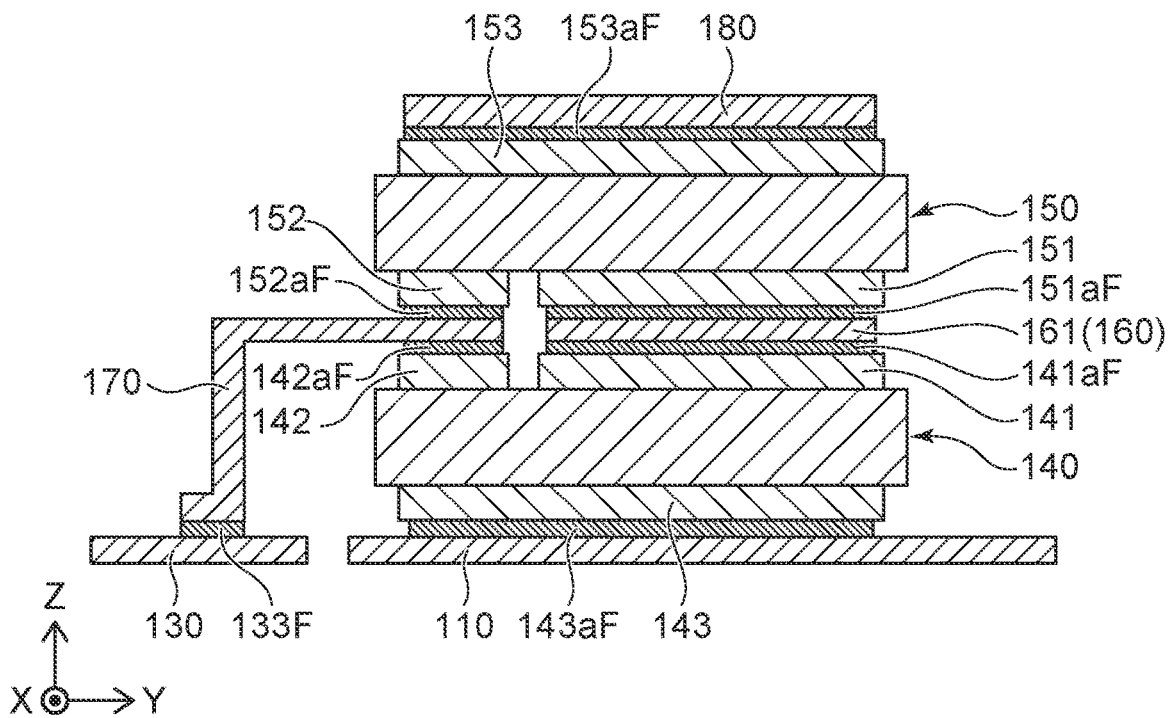
FIG. 10B is a cross-sectional view showing the method for manufacturing the semiconductor device according to the first embodiment.

FIG. 10A is a top view showing the method for manufacturing the semiconductor device according to the embodiment, and FIG. 10B is a cross-sectional view showing the method for manufacturing the semiconductor device according to the embodiment.

Figure 11A:
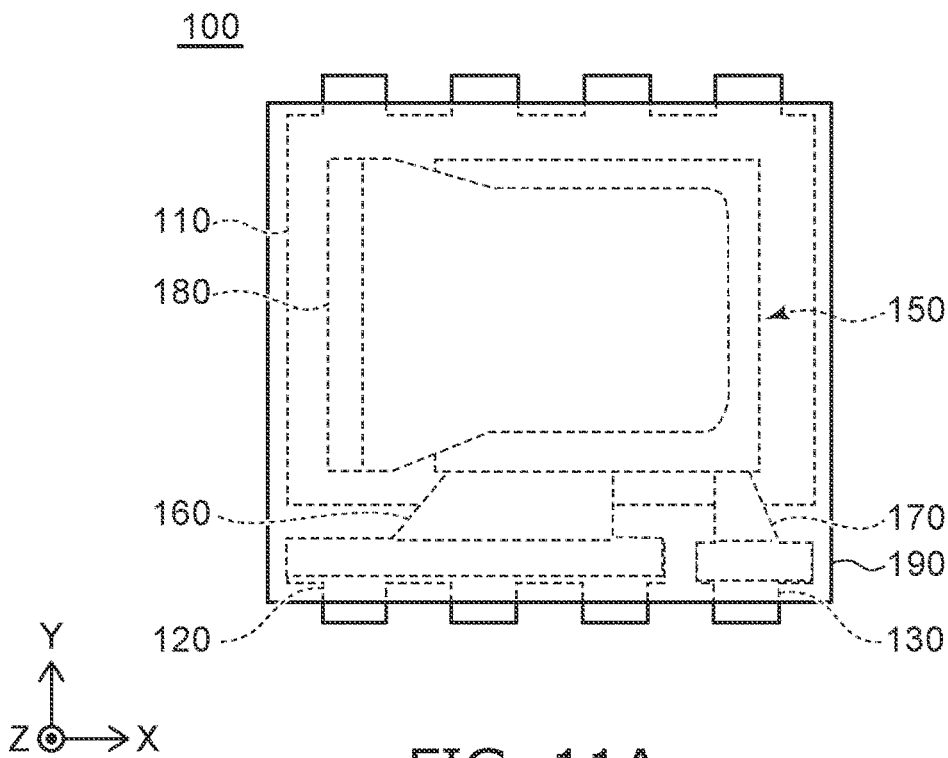
FIG. 11A is a top view showing the method for manufacturing the semiconductor device according to the first embodiment.
Figure 11B:
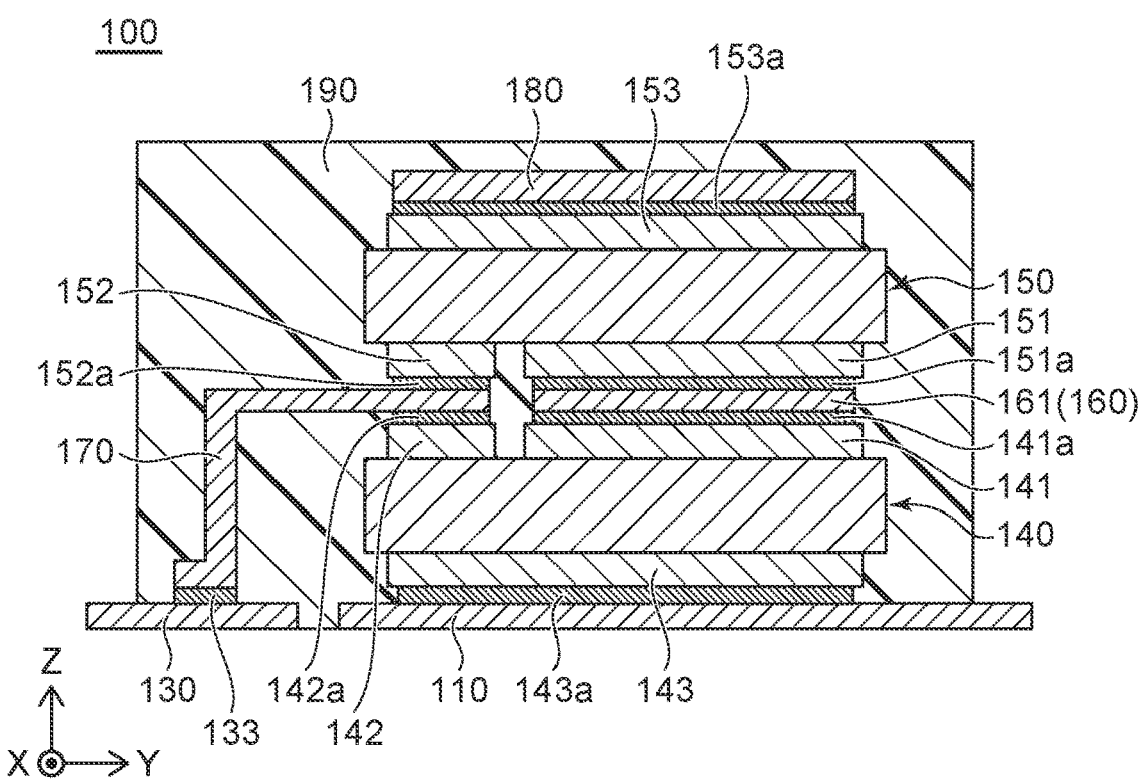
FIG. 11B is a cross-sectional view showing the method for manufacturing the semiconductor device according to the first embodiment.

FIG. 11A is a top view showing the method for manufacturing the semiconductor device according to the embodiment, and FIG. 11B is a cross-sectional view showing the method for manufacturing the semiconductor device according to the embodiment.

First, as shown in FIG. 7B, unsolidified solder 143aF is disposed on the substrate 110. Then, the first chip 140 is disposed so that the drain electrode 143 faces the substrate 110.

Then, unsolidified solder 141aF is disposed on the source electrode 141 of the first chip 140; and unsolidified solder 142aF is disposed on the gate electrode 142 of the first chip 140. As shown in FIG. 7A, unsolidified solder 123F is disposed on the first lead 120; and unsolidified solder 133F is disposed on the second lead 130.

Continuing as shown in FIGS. 8A and 8B, the first connector 160 is disposed on the first lead 120 and the source electrode 141 of the first chip 140; and the second connector 170 is disposed on the second lead 130 and the gate electrode 142 of the first chip 140.

Then, as shown in FIG. 8A, unsolidified solder 151aF is disposed on the first distal part 161 of the first connector 160; and unsolidified solder 152aF is disposed on the second distal part 171 of the second connector 170.

Continuing as shown in FIG. 9B, the second chip 150 is disposed on the first and second connectors 160 and 170 so that the source electrode 151 faces the source electrode 141 of the first chip 140, and the gate electrode 152 faces the gate electrode 142 of the first chip 140.

Then, as shown in FIG. 9A, unsolidified solder 153aF is disposed on the drain electrode 153 of the second chip 150. Also, unsolidified solder 113F is disposed on the substrate 110.

Continuing as shown in FIGS. 10A and 10B, the third connector 180 is disposed on the second chip 150.

Then, the solder 141aF, 142aF, 143aF, 151aF, 152aF, 153aF, 113F, 123F, and 133F are solidified. The bonding members 141a, 142a, 143a, 151a, 152a, 153a, 113, 123, and 133 are formed thereby.

Then, as shown in FIGS. 11A and 11B, the first chip 140, the second chip 150, the first connector 160, the second connector 170, and the third connector 180 are sealed by the resin member 190. The semiconductor device 100 is formed thereby.

Effects of the embodiment will now be described.

The first chip 140 and the second chip 150 are connected in parallel by the substrate 110, the first connector 160, the second connector 170, and the third connector 180. Thereby, the current that is outputtable by the semiconductor device 100 can be increased while suppressing the on-resistance of the semiconductor device 100. In particular, in the embodiment, the breakdown voltages of the first and second chips 140 and 150 are not less than 100 V. The percentage of the on-resistance of the transistors in the total on-resistance of the semiconductor device 100 increases as the breakdown voltages of the chips 140 and 150 increase. Therefore, the effect of suppressing the on-resistance by the parallel connection becomes pronounced as the breakdown voltages of the chips 140 and 150 increase.

Also, the first chip 140 and the second chip 150 are stacked. Therefore, an increase of the surface area of the semiconductor device 100 when viewed in plan can be suppressed while connecting the first chip 140 and the second chip 150.

On the other hand, when the first chip 140 and the second chip 150 are stacked, the heat that is generated in the first and second chips 140 and 150 becomes difficult to dissipate at the portion between the first chip 140 and the second chip 150. The on-voltages of the first and second chips 140 and 150 decrease as the temperatures of the first and second chips 140 and 150 increase. The currents that flow through the first and second chips 140 and 150 increase as the on-voltages of the first and second chips 140 and 150 decrease. The temperatures of the first and second chips 140 and 150 increase as the currents that flow through the first and second chips 140 and 150 increase. Thus, there is a possibility that thermal runaway of the semiconductor device 100 may occur because the heat that is generated in the first and second chips 140 and 150 is not easily dissipated. In the embodiment, the heat that is generated in the first and second chips 140 and 150 can be efficiently dissipated by the first and second connectors 160 and 170. The thermal runaway of the first and second chips 140 and 150 can be suppressed thereby.

In the embodiment, the source electrodes 141 and 151 and the gate electrodes 142 and 152 are made of metal materials having higher thermal conductivities than the bonding members 141a, 151a, 142a, and 152a, and have film thicknesses that are not less than 5 μm and not more than 20 μm. Therefore, the heat that is generated inside the first chip 140 and the second chip 150 is easily transmitted and dissipated through the source electrodes 141 and 151 and the gate electrodes 142 and 152. As a result, the thermal runaway of the first and second chips 140 and 150 can be suppressed.

Second Embodiment

A second embodiment will now be described.

Figure 12A:
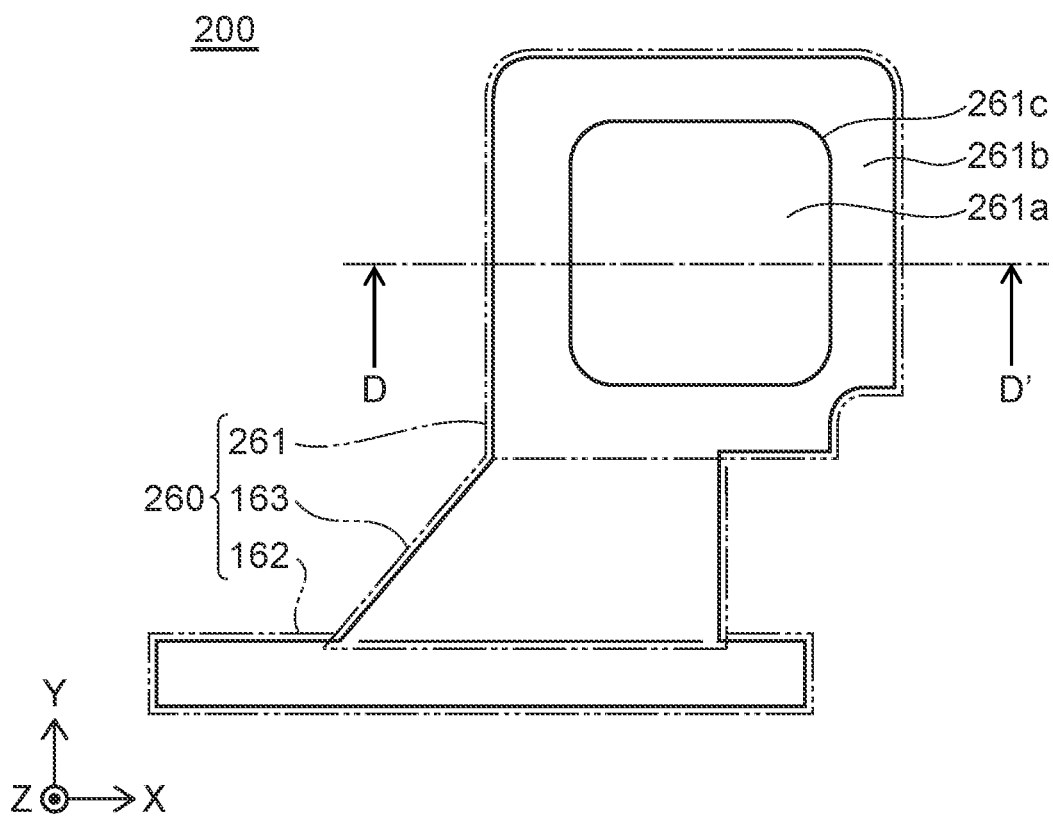
FIG. 12A is a top view showing a first connector of a semiconductor device according to a second embodiment.
Figure 12B:
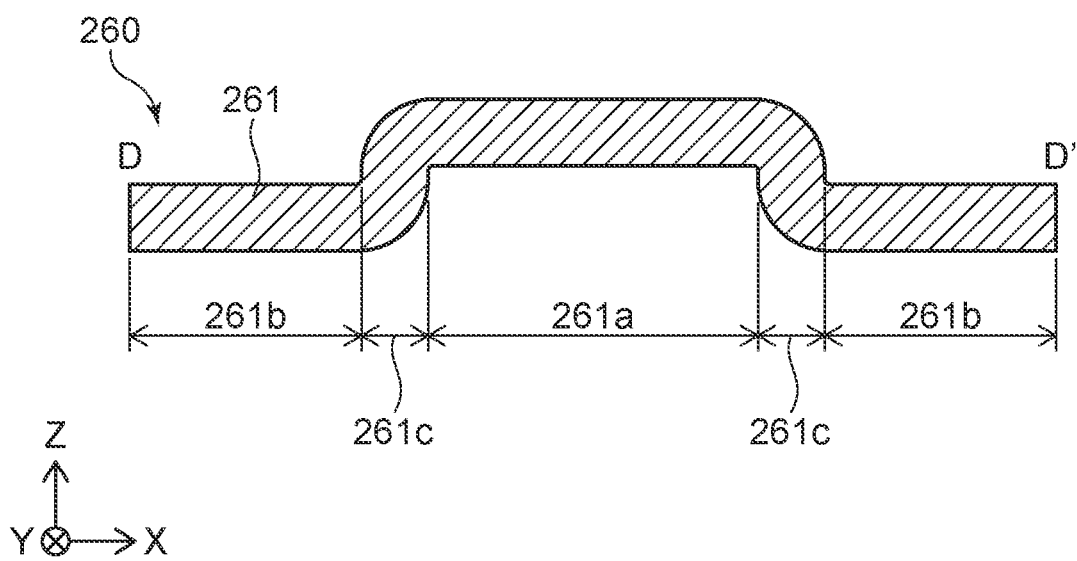
FIG. 12B is a cross-sectional view along line D-D' of FIG. 12A.

FIG. 12A is a top view showing a first connector of a semiconductor device according to the embodiment, and FIG. 12B is a cross-sectional view along line D-D' of FIG. 12A.

Figure 13:
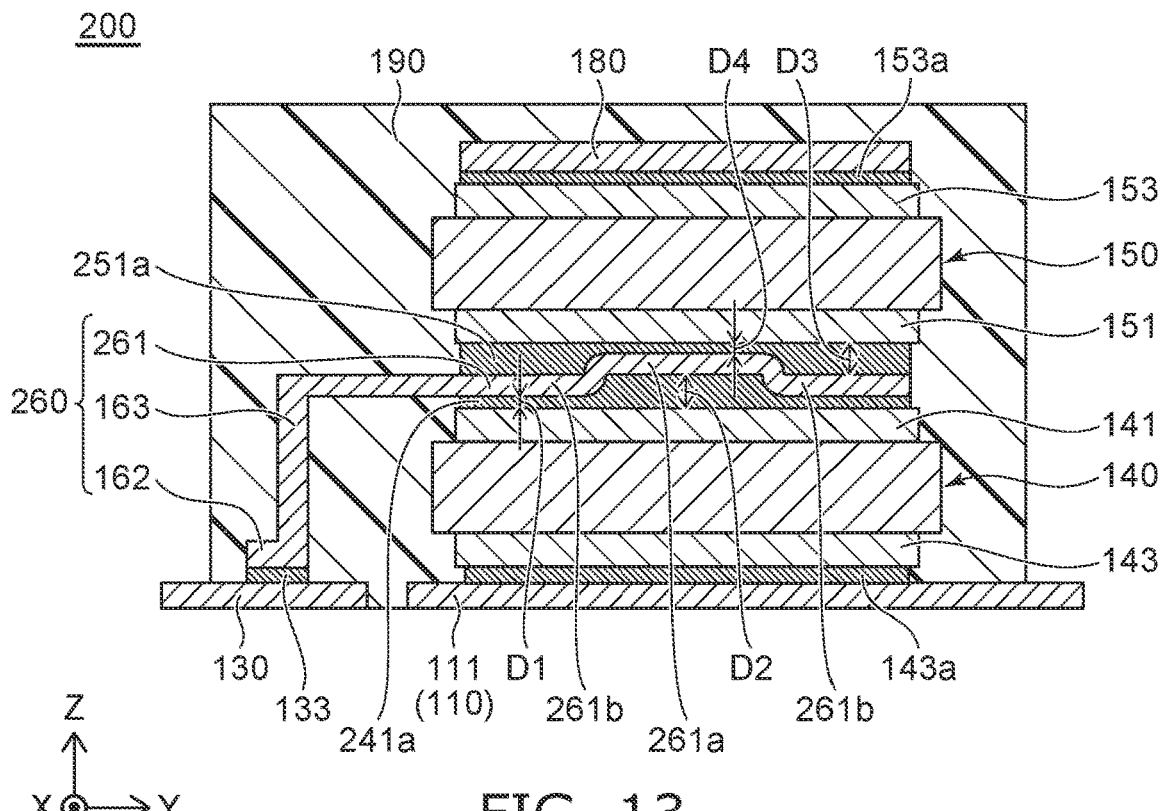
FIG. 13 is a cross-sectional view showing the semiconductor device according to the second embodiment.

FIG. 13 is a cross-sectional view showing the semiconductor device according to the embodiment.

Figure 14:
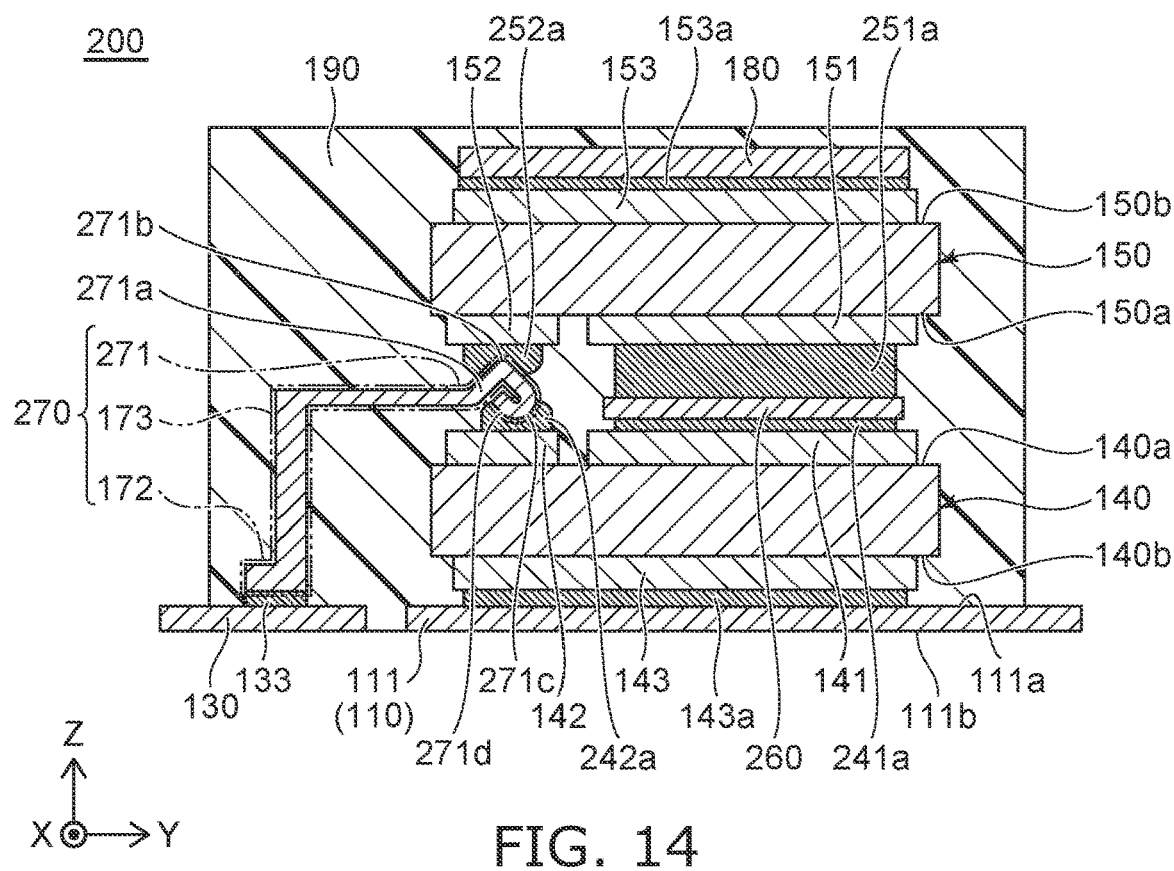
FIG. 14 is a cross-sectional view showing the semiconductor device according to the second embodiment.

FIG. 14 is a cross-sectional view showing the semiconductor device according to the embodiment.

The shapes of a first distal part 261 of a first connector 260 and a second distal part 271 of a second connector 270 in the semiconductor device 200 according to the embodiment are different from those of the semiconductor device 100 according to the first embodiment.

As a general rule, only the differences with the first embodiment are described in the following description. Other than the items described below, the embodiment is similar to the first embodiment.

As shown in FIGS. 12A and 12B, the substantially central portion of the first distal part 261 of the first connector 260 is stamped. Specifically, the first distal part 261 includes a first portion 261a, a second portion 261b, and a third portion 261c.

The first portion 261a is positioned at substantially the center of the first distal part 261. The first portion 261a is rectangular with rounded corners when viewed in top-view. However, the shape of the first portion 261a is not limited to that described above. The upper surface and the lower surface of the first portion 261a are substantially parallel to the X-direction and the Y-direction.

The second portion 261b is positioned lower than the first portion 261a and is provided at the periphery of the first portion 261a. The upper surface and the lower surface of the second portion 261b are substantially parallel to the X-direction and the Y-direction.

The third portion 261c is connected to the first and second portions 261a and 261b and extends in a direction including the Z-direction.

As shown in FIG. 13, a bonding member 241a is provided between the first distal part 261 and the source electrode 141 of the first chip 140; and a bonding member 251a is provided between the first distal part 261 and the source electrode 151 of the second chip 150. The bonding members 241a and 251a are formed by solidifying solder.

A distance D1 between the second portion 261b and the source electrode 141 of the first chip 140 is less than a distance D2 between the first portion 261a and the source electrode 141. A distance D3 between the second portion 261b and the source electrode 151 of the second chip 150 is greater than a distance D4 between the first portion 261a and the source electrode 151. The gap between the first chip 140 and the second chip 150 can be increased thereby. As a result, the unsolidified solder when manufacturing is easily maintained between the first chip 140 and the second chip 150. Therefore, the electrical connection to the source electrodes 141 and 151 and the drain electrodes 143 and 153 of the unsolidified solder due to the unsolidified solder moving over the side surfaces of the chips 140 and 150 and contacting the drain electrodes 143 and 153 can be suppressed.

Because the first connector 260 includes the first portion 261a and the second portion 261b, the surface area of the first connector 260 that is connected to the source electrodes 141 and 151 can be increased. As a result, the resistance between the first connector 260 and the source electrodes 141 and 151 can be reduced. In such a case, it is favorable for the surface area of the upper surface of the first portion 261a to be substantially equal to the surface area of the lower surface of the second portion 261b. The difference between the resistance between the first connector 260 and the source electrode 141 of the first chip 140 and the resistance between the first connector 260 and the source electrode 151 of the second chip 150 can be reduced thereby. As a result, the difference between the current that flows into the first chip 140 and the current that flows into the second chip 150 can be suppressed. However, the size relationship between the surface area of the upper surface of the first portion and the surface area of the lower surface of the second portion is not limited to that described above.

As shown in FIG. 14, the second distal part 271 of the second connector 270 has a rounded or multiply-bent shape in which four curved portions 271a, 271b, 271c, and 271d are formed.

A bonding member 242a is provided between the second distal part 271 and the gate electrode 142 of the first chip 140; and a bonding member 252a is provided between the second distal part 271 and the gate electrode 152 of the second chip 150. The bonding members 242a and 252a are formed by solidifying solder.

Because the second distal part 271 of the second connector 270 includes the curved portions 271a, 271b, 271c, and 271d as described above, the gap between the first chip 140 and the second chip 150 can be increased. As a result, the unsolidified solder when manufacturing is easily maintained between the first chip 140 and the second chip 150. Therefore, the electrical connection to the gate electrodes 142 and 152 and the drain electrodes 143 and 153 of the unsolidified solder due to the unsolidified solder moving over the side surfaces of the chips 140 and 150 and contacting the drain electrodes 143 and 153 can be suppressed.

Thus, in the semiconductor device 200 according to the embodiment, the first distal part 261 of the first connector 260 includes the first portion 261a, and the second portion 261b that is provided at the periphery of the first portion 261a, in which the distance D1 between the second portion 261b and the source electrode 141 of the first chip 140 is less than the distance D2 between the first portion 261a and the source electrode 141, and the distance D3 between the second portion 261b and the source electrode 151 of the second chip 150 is greater than the distance D4 between the first portion 261a and the source electrode 151. Therefore, the electrical connection to the drain electrodes 143 and 153 of the source electrodes 141 and 151 can be suppressed while increasing the contact area of the first connector 260 with the source electrodes 141 and 151.

The second distal part 271 of the second connector 270 includes the curved portions 271a, 271b, 271c, and 271d. Therefore, the electrical connection to the drain electrodes 143 and 153 of the gate electrodes 142 and 152 can be suppressed.

Third Embodiment

A third embodiment will now be described.

Figure 15A:
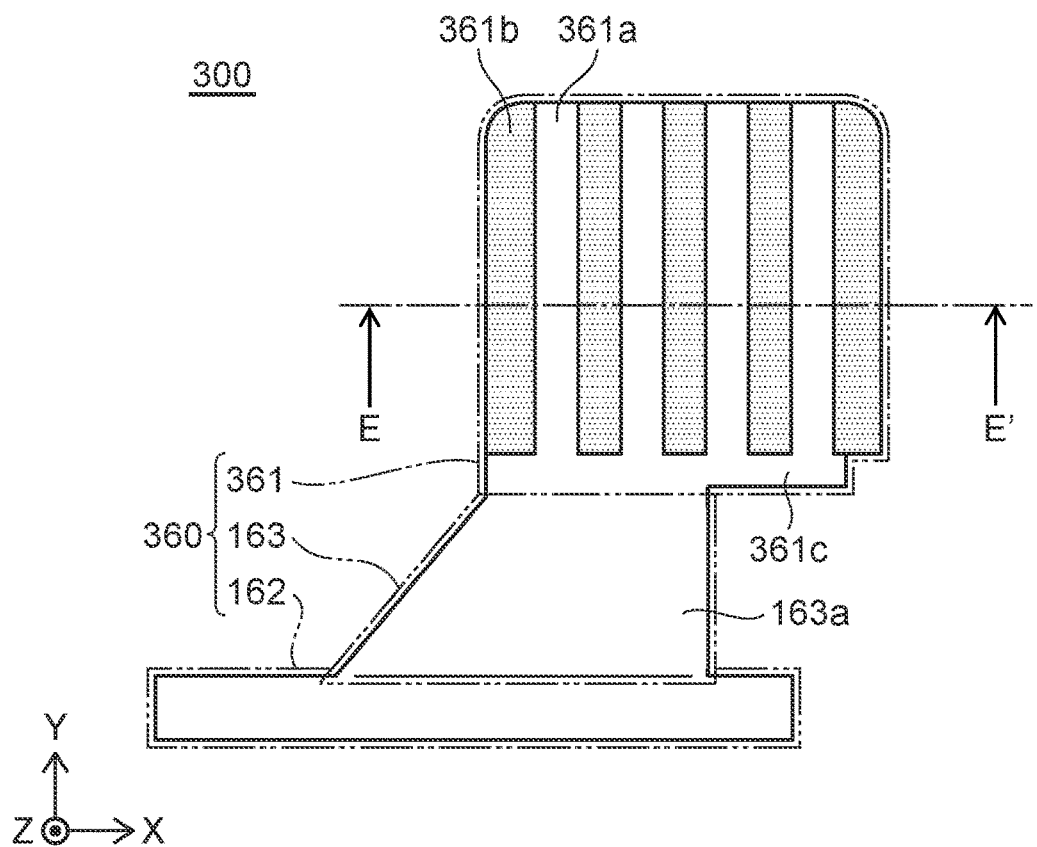
FIG. 15A is a top view showing a first connector of a semiconductor device according to a third embodiment.
Figure 15B:
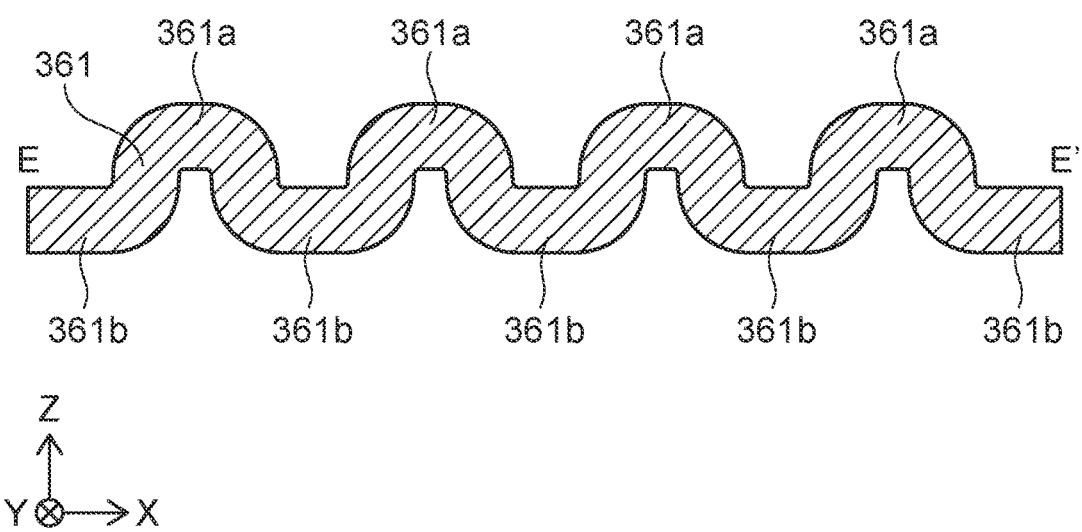
FIG. 15B is a cross-sectional view along line E-E' of FIG. 15A.

FIG. 15A is a top view showing a first connector of a semiconductor device according to the embodiment, and FIG. 15B is a cross-sectional view along line E-E' of FIG. 15A.

The shape of a first distal part 361 of a first connector 360 in the semiconductor device 300 according to the embodiment is different from that of the semiconductor device 100 according to the first embodiment.

For example, the portion of the first distal part 361 of the first connector 360 other than an end portion 361c positioned at the first middle part 163 side in the Y-direction is bent into a wave shape by bending at multiple locations by stamping. Thereby, the first connector includes multiple first portions 361a and multiple second portions 361b that are alternately arranged. However, the entire first distal part may be bent into a wave shape. In FIG. 15A, the regions where the second portions 361b are provided is illustrated by a dot pattern.

The positions of the multiple first portions 361a are substantially the same as the positions of the end portion 361c and the first portion 163a of the first middle part 163 in the vertical direction. The multiple second portions 361b are positioned lower than the multiple first portions 361a. In the embodiment, the multiple first portions 361a and the multiple second portions 361b extend in the Y-direction. However, the multiple first portions and the multiple second portions may extend in the X-direction or may extend in a direction oblique to the X-direction and the Y-direction. It is sufficient for the number of the first portions to be not less than 1 and for the number of the second portions to be not less than 1.

It is favorable for the total of the surface areas of the upper surfaces of the multiple first portions 361a and the surface area of the upper surface of the end portion 361c to be substantially equal to the total of the surface areas of the lower surfaces of the multiple second portions 361b. The difference between the resistance between the first connector 360 and the source electrode 141 of the first chip 140 and the resistance between the first connector 360 and the source electrode 151 of the second chip 150 can be reduced thereby. As a result, the difference between the current that flows into the first chip 140 and the current that flows into the second chip 150 can be suppressed. However, the size relationship between the total of the surface areas of the upper surfaces of the multiple first portions and the surface area of the upper surface of the end portion and the total of the surface areas of the lower surfaces of the multiple second portions is not limited to that described above.

In the embodiment as described above, the first distal part 361 of the first connector 360 has a wave-like shape. Therefore, the contact area of the first connector 260 with the source electrodes 141 and 151 can be increased. Because the gap between the source electrodes 141 and 151 can be increased thereby, the unsolidified solder is easily maintained. Therefore, the electrical connection to the drain electrodes 143 and 153 of the source electrodes 141 and 151 due to the solder moving over the side surfaces of the chips 140 and 150 can be suppressed.

Fourth Embodiment

A fourth embodiment will now be described.

Figure 16:
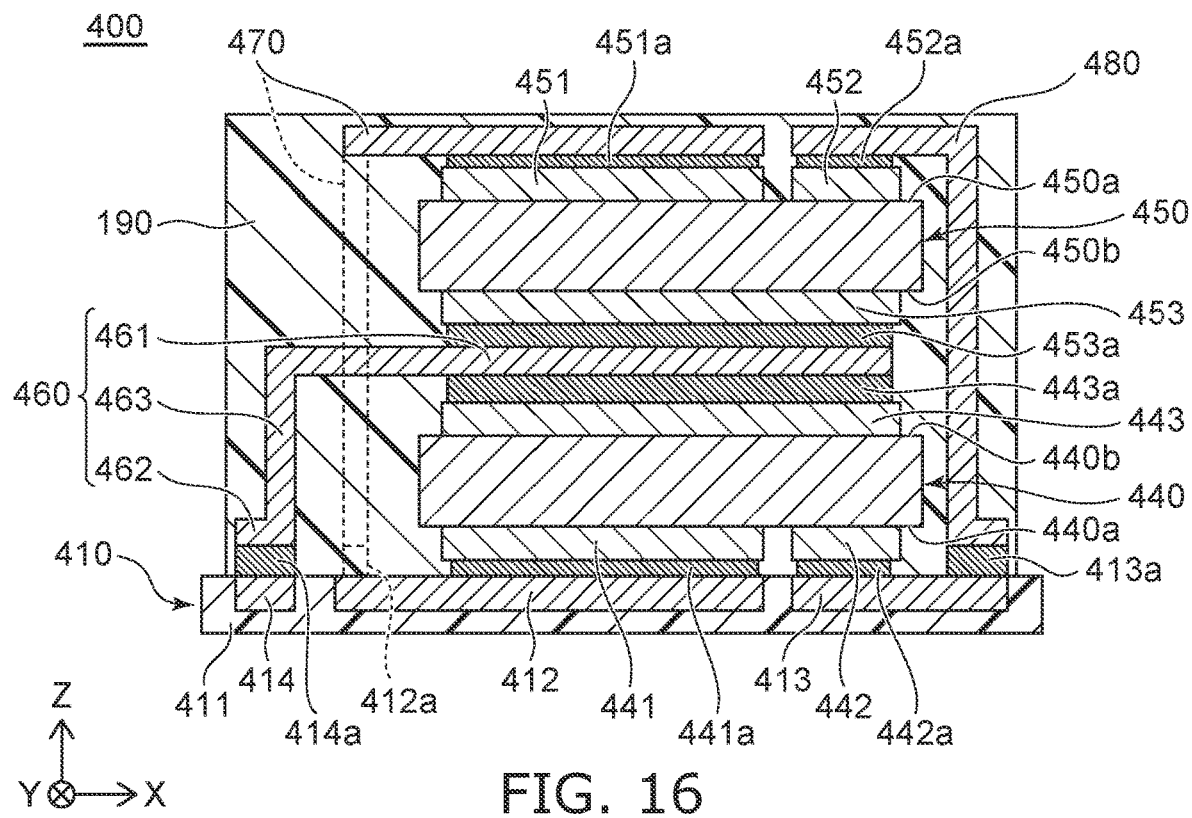
FIG. 16 is a cross-sectional view showing a semiconductor device according to a fourth embodiment.

FIG. 16 is a cross-sectional view showing a semiconductor device according to the embodiment.

The semiconductor device 400 according to the embodiment differs from the first embodiment in that a first chip 440 and a second chip 450 are disposed so that drain electrodes 443 and 453 face each other, etc.

A substrate 410 includes an insulating layer 411, and includes a first interconnect 412, a second interconnect 413, and a third interconnect 414 that are provided in the insulating layer 411. The first chip 440 is provided on the substrate 410.

A source electrode 441 and a gate electrode 442 are provided at a lower surface (a first surface) 440a of the first chip 440. The source electrode 441 is connected to the first interconnect 412 by a bonding member 441a such as solder, etc. The gate electrode 442 is connected to the second interconnect 413 by a bonding member 442a such as solder, etc.

The drain electrode 443 is provided at an upper surface (a second surface) 440b of the first chip 440. The second chip 450 is provided above the first chip 440 to face the first chip 440.

A source electrode 451 and a gate electrode 452 are provided at an upper surface (a third surface) 450a of the second chip 450.

A drain electrode 453 is provided at a lower surface (a fourth surface) 450b of the second chip 450. The drain electrode 453 faces the drain electrode 443 of the first chip 440. A first connector 460 is provided between the first chip 440 and the second chip 450.

The first connector 460 includes a distal part 461 that is positioned between the first chip 440 and the second chip 450, a proximal part 462 that is positioned on the third interconnect 414, and a middle part 463 that is positioned between the distal part 461 and the proximal part 462.

In the embodiment, the distal part 461 is flat-plate shaped. The distal part 461 is connected to the drain electrode 443 of the first chip 440 by a bonding member 443a such as solder, etc. Also, the distal part 461 is connected to the drain electrode 453 of the second chip 450 by a bonding member 453a such as solder, etc.

The proximal part 462 is flat-plate shaped. The proximal part 462 is connected to the third interconnect 414 of the substrate 410 by a bonding member 414a such as solder, etc.

The middle part 463 is connected to the end portion of the distal part 461 and the upper end of the proximal part 462.

A second connector 470 is provided on the source electrode 451 of the second chip 450. The second connector 470 is connected to the source electrode 451 by a bonding member 451a such as solder, etc. Also, the second connector 470 is connected to the first interconnect 412 of the substrate 410 by a bonding member 412a such as solder, etc.

A third connector 480 is provided on the gate electrode 452 of the second chip 450. The third connector 480 is connected to the gate electrode 452 by a bonding member 452a such as solder, etc. Also, the third connector 480 is connected to the second interconnect 413 of the substrate 410 by a bonding member 413a such as solder, etc.

The first connector 460, the second connector 470, and the third connector 480 are separated from each other. For example, the first connector 460, the second connector 470, and the third connector 480 are made of metal materials such as copper or the like that have high thermal conductivities.

As described above, the first chip 440 and the second chip 450 may be disposed so that the drain electrodes 443 and 453 face each other. In such a case as well, the current that is outputtable by the semiconductor device 100 can be increased while suppressing the on-resistance of the semiconductor device 100. Also, in such a case, the first chip 440 and the second chip 450 are stacked. Therefore, the increase of the surface area of the semiconductor device 400 when viewed in plan can be suppressed.

Fifth Embodiment

A fifth embodiment will now be described.

Figure 17:
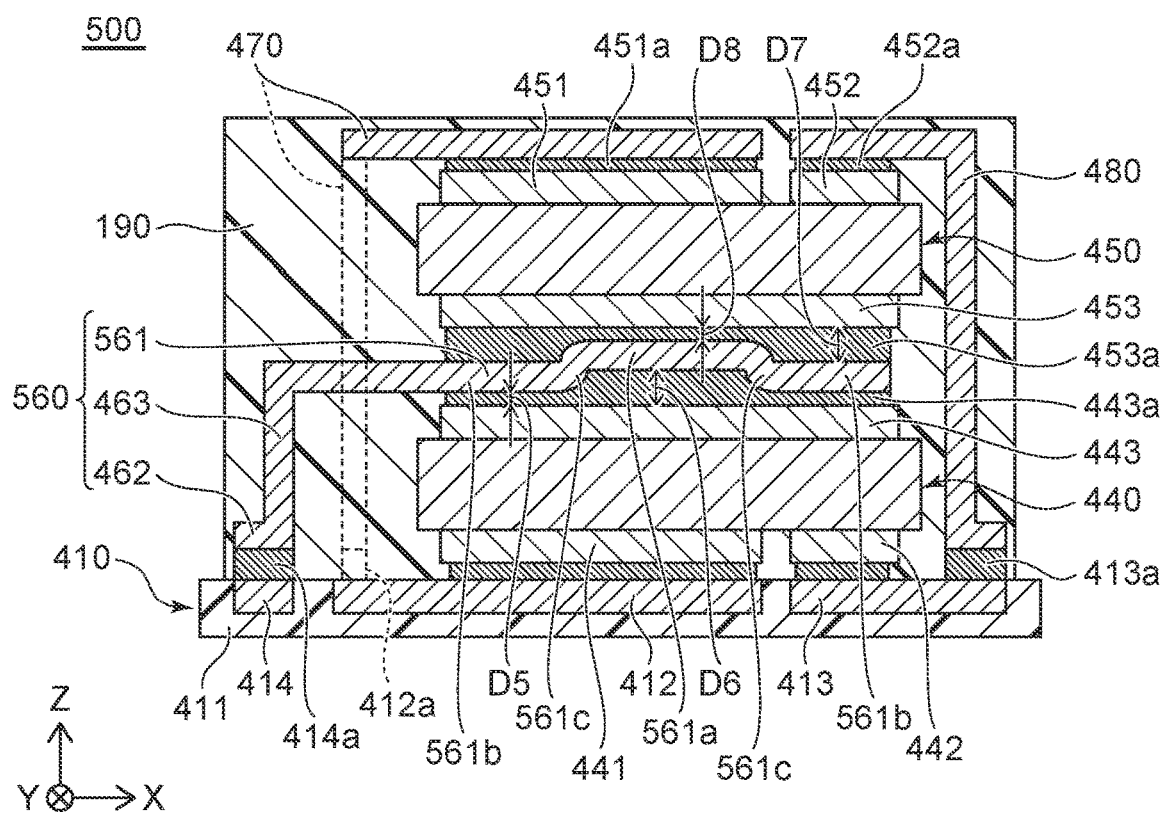
FIG. 17 is a cross-sectional view showing a semiconductor device according to a fifth embodiment.

FIG. 17 is a cross-sectional view showing a semiconductor device according to the embodiment.

The shape of a distal part 561 of a first connector 560 in the semiconductor device 500 according to the embodiment is different from that of the semiconductor device 400 according to the fourth embodiment.

As a general rule, only the differences with the fourth embodiment are described in the following description. Other than the items described below, the embodiment is similar to the fourth embodiment.

The distal part 561 of the first connector 560 has a shape substantially similar to the first distal part 261 of the first connector 260 of the second embodiment. Specifically, the distal part 561 includes a first portion 561a, a second portion 561b that is provided at the periphery of the first portion 561a, and a third portion 561c that is provided between the first portion 561a and the second portion 561b and connected to the first and second portions 561a and 561b.

A distance D5 between the second portion 561b and the drain electrode 443 of the first chip 440 is less than a distance D6 between the first portion 561a and the drain electrode 443. Also, a distance D7 between the second portion 561b and the drain electrode 453 of the second chip 450 is greater than a distance D8 between the first portion 561a and the drain electrode 453.

In the distal part 561 of the first connector 560 of the embodiment as described above, the distance D5 between the second portion 561b and the drain electrode 443 of the first chip 440 is less than the distance D6 between the first portion 561a and the drain electrode 443. Also, the distance D7 between the second portion 561b and the drain electrode 453 of the second chip 450 is greater than the distance D8 between the first portion 561a and the drain electrode 453. Therefore, the electrical connection of the drain electrodes 443 and 453 to the source electrodes 441 and 451 or the gate electrodes 442 and 452 can be suppressed while increasing the contact area of the first connector 560 with the drain electrodes 443 and 453.

Sixth Embodiment

A sixth embodiment will now be described.

Figure 18:
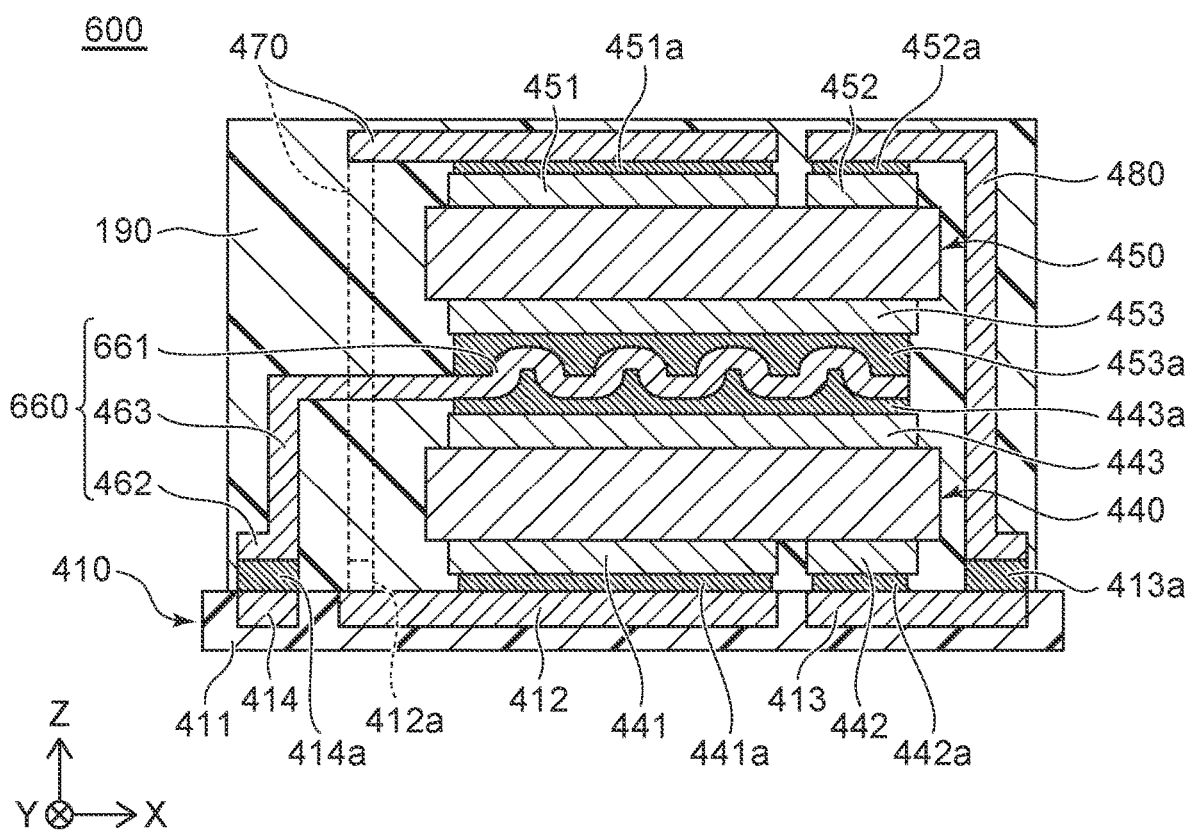
FIG. 18 is a cross-sectional view showing a semiconductor device according to a sixth embodiment.

FIG. 18 is a cross-sectional view showing a semiconductor device according to the embodiment.

The shape of a distal part 661 of a first connector 660 in the semiconductor device 600 according to the embodiment is different from that of the semiconductor device 400 according to the fourth embodiment.

The distal part 661 of the first connector 660 has a shape substantially similar to the first distal part 361 of the first connector 360 of the third embodiment. Specifically, for example, the distal part 661 has a wave-like shape that is bent at multiple locations by stamping. Therefore, the electrical connection of the drain electrodes 443 and 453 to the source electrodes 441 and 451 or the gate electrodes 442 and 452 can be suppressed while increasing the contact area of the first connector 660 with the drain electrodes 443 and 453.

Modification of First Connector

Figure 19A:
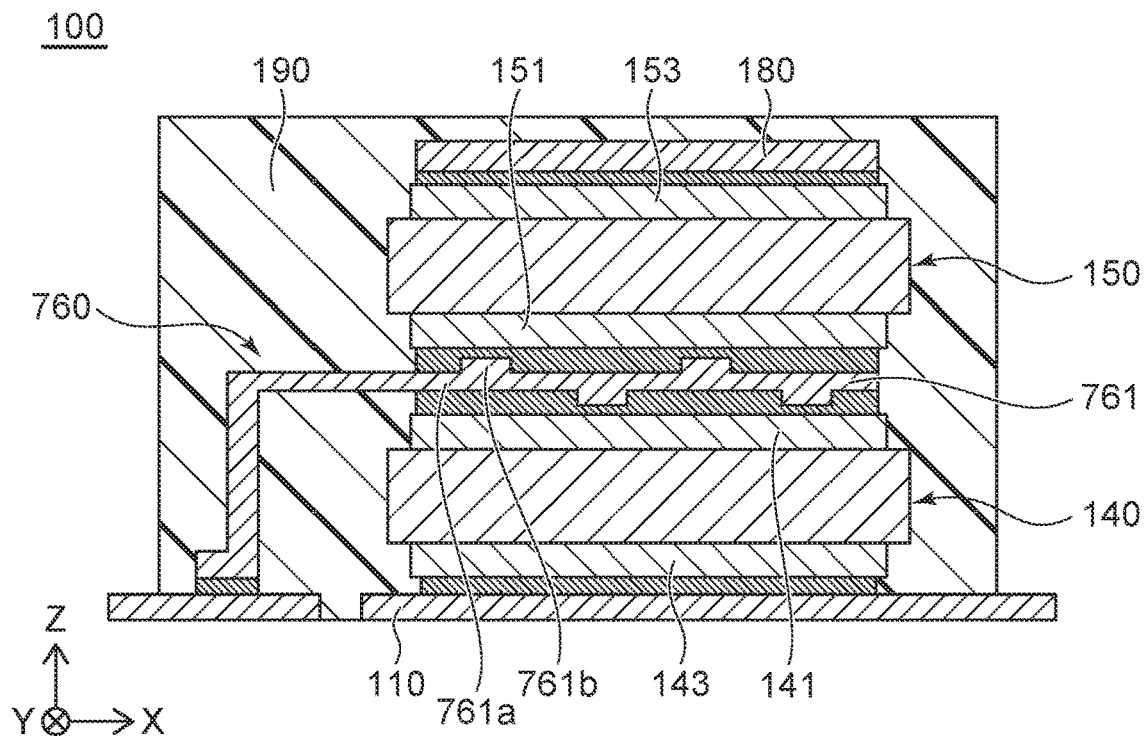
FIG. 19A is a cross-sectional view showing a modification of the first connector.
Figure 19B:
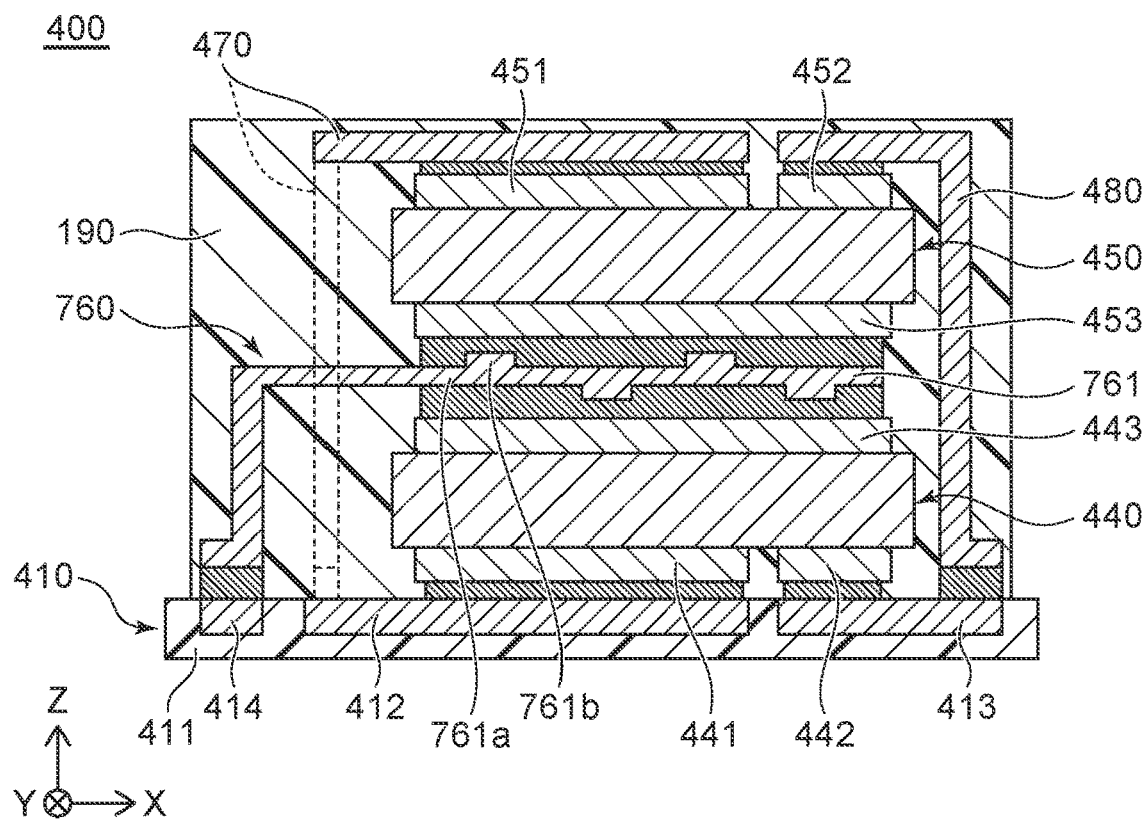
FIG. 19B is a cross-sectional view showing a modification of the first connector.

FIG. 19A is a cross-sectional view showing a modification of the first connector, and FIG. 19B is a cross-sectional view showing a modification of the first connector.

The first connector 160 of the first embodiment and the first connector 460 of the fourth embodiment may be replaced with a first connector 760 shown in FIGS. 19A and 19B. A distal part 761 of the first connector 760 includes a flat plate part 761a, and not less than one protrusion 761b provided at the flat plate part 761a. It is favorable for the number of the protrusions 761b provided at the upper surface of the flat plate part 761a and the number of the protrusions 761b provided at the lower surface of the flat plate part 761a to be equal. However, the number of the protrusions 761b is not particularly limited as long as the number of the protrusions 761b is not less than 1.

As described above, the distal part 761 of the first connector 760 includes the protrusion 761b that protrudes toward the first chip 140 or the second chip 150. By such a configuration as well, the contact area between the first connector 760 and the electrodes connected to the first connector 760 can be increased. Also, the gap between the first chips 140 and 440 and the second chips 150 and 450 can be increased. As a result, the unsolidified solder can be prevented from moving over the side surfaces of the chips 140, 150, 440, and 450.

Modifications of First and Second Chips

Figure 20A:
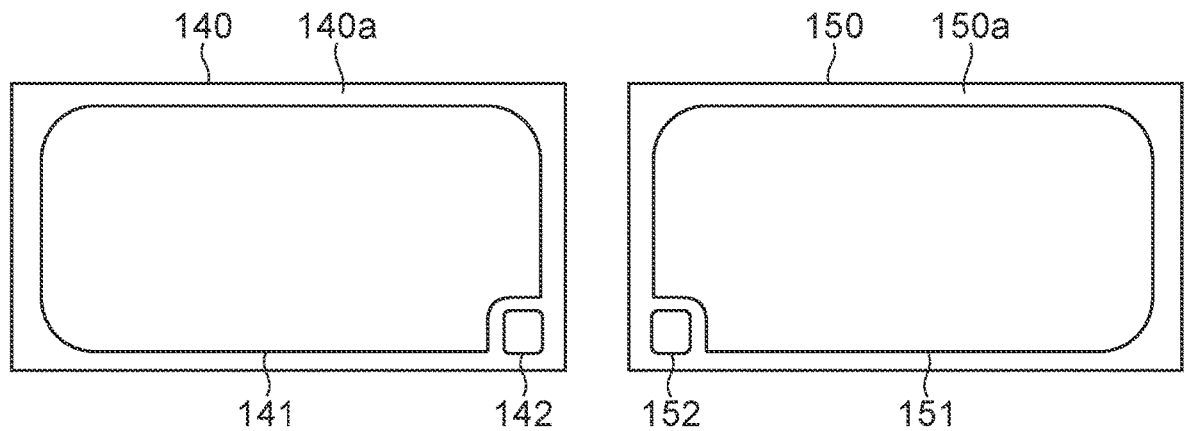
FIGS. 20A and 20B are plan views showing modifications of the first and second chips.
Figure 20B:
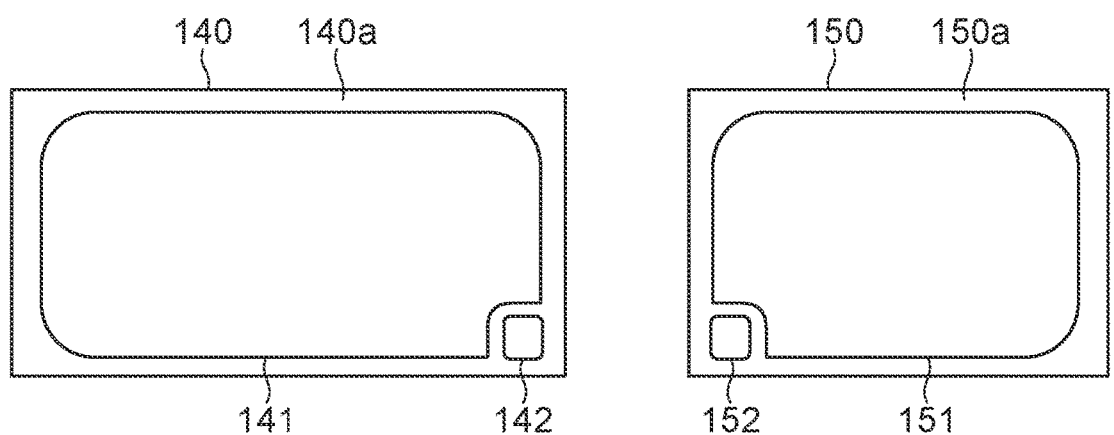

FIGS. 20A and 20B are plan views showing modifications of the first and second chips.

An example is described in the first embodiment in which the shapes of the first and second chips 140 and 150 are square, and the first chip 140 is symmetric with the second chip 150 with respect to the plane P.

However, as shown in FIG. 20A, the shapes of the first and second chips 140 and 150 may be rectangular.

As shown in FIG. 20B, the first chip 140 may not be symmetric with the second chip 150 with respect to the plane P (referring to FIG. 5). For example, the surface area of the source electrode 141 of the first chip 140 may be greater than the surface area of the source electrode 151 of the second chip 150. The surface area of the source electrode of the first chip may be greater than the surface area of the source electrode of the second chip.

As described above, the specific shapes of the first and second chips and the surface areas of the electrodes are not particularly limited as long as the corresponding electrodes of the first and second chips can be electrically connected to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
a first chip including
a first source electrode and a first gate electrode provided at a first surface of the first chip, and
a first drain electrode provided at a second surface of the first chip, the second surface being positioned at a side opposite to the first surface;
a second chip including
a second source and a second gate electrode provided at a third surface of the second chip, the second chip being disposed to cause the third surface to face the first surface, and
a second drain electrode provided at a fourth surface of the second chip, the fourth surface being positioned at a side opposite to the third surface;
a first connector disposed between the first chip and the second chip and connected to the first source electrode and the second source electrode; and
a second connector disposed between the first chip and the second chip and connected to the first gate electrode and the second gate electrode.

2. The device according to claim 1, further comprising:
a substrate connected to the first drain electrode and disposed to face the second surface of the first chip; and
a third connector connected to the substrate and the second drain electrode of the second chip.

3. The device according to claim 2, wherein
the first connector comprises a first part facing a first side surface of the first chip, and
the third connector comprises a third part facing a second side surface of the first chip.

4. The device according to claim 3, wherein
the second connector comprises a second part facing the first side surface of the first chip.

5. The device according to claim 3, wherein
the first side surface is connected to the second side surface, and
the first side surface is in non-parallel to the second side surface.

6. The device according to claim 2, wherein
the second surface is closer to the substrate than the first surface, and the third surface is closer to the substrate than the fourth surface.

7. The device according to claim 1, wherein
the first connector includes a first distal part positioned between the first source electrode and the second source electrode,
the first distal part includes:
a first portion; and
a second portion provided at a periphery of the first portion,
a distance between the second portion and the first source electrode is less than a distance between the first portion and the first source electrode, and
a distance between the second portion and the second source electrode is greater than a distance between the first portion and the second source electrode.

8. The device according to claim 1, wherein
the first connector includes a first distal part positioned between the first source electrode and the second source electrode, and
the first distal part has a wave-like shape.

9. The device according to claim 1, wherein
the first connector includes a first distal part positioned between the first source electrode and the second source electrode, and
the first distal part includes a protrusion protruding toward the first source electrode or the second source electrode.

10. The device according to claim 1, wherein
the second connector includes a second distal part positioned between the first gate electrode and the second gate electrode, and
the second distal part includes a curved portion.

11. The device according to claim 1, wherein
the first source electrode and the first gate electrode are in direct contact with the first surface, and the first drain electrode is in direct contact with the second surface, and
the second source electrode and the second gate electrode are in direct contact with the third surface, and the second drain electrode is in direct contact with the fourth surface.

12. A semiconductor device, comprising:
a first chip including
a first source electrode and a first gate electrode provided at a first surface of the first chip, and
a first drain electrode provided at a second surface of the first chip, the second surface being positioned at a side opposite to the first surface;
a second chip including
a second source and a second gate electrode provided at a third surface of the second chip, and
a second drain electrode provided at a fourth surface of the second chip, the fourth surface being positioned at a side opposite to the third surface, the second chip being disposed to cause the fourth surface to face the second surface; and
a first connector disposed between the first drain electrode and the second drain electrode and connected to the first drain electrode and the second drain electrode.

13. The device according to claim 12, further comprising:
a substrate disposed to face the first surface of the first chip, the substrate including
a first interconnect connected to the first source electrode, and
a second interconnect connected to the first gate electrode;
a second connector connected to the first interconnect and the second source electrode of the second chip; and
a third connector connected to the second interconnect and the second gate electrode of the second chip.

14. The device according to claim 13, wherein
the first surface is closer to the substrate than the second surface, and
the fourth surface is closer to the substrate than the third surface.

15. The device according to claim 12, wherein
the first connector includes a distal part positioned between the first drain electrode and the second drain electrode,
the distal part includes:
a first portion; and
a second portion provided at a periphery of the first portion,
a distance between the second portion and the first drain electrode is less than a distance between the first portion and the first drain electrode, and
a distance between the second portion and the second drain electrode is greater than a distance between the first portion and the second drain electrode.

16. The device according to claim 12, wherein
the first connector includes a distal part positioned between the first drain electrode and the second drain electrode, and
the distal part has a wave-like shape.

17. The device according to claim 12, wherein
the first connector includes a distal part positioned between the first drain electrode and the second drain electrode, and
the distal part includes a protrusion protruding toward the first drain electrode or the second drain electrode.

18. The device according to claim 12, wherein
the first drain electrode is in direct contact with the second surface, and
the second drain electrode is in direct contact with the fourth surface.

* * * * *